United States Patent [19]
Novak et al.

[11] Patent Number: 5,623,853
[45] Date of Patent: Apr. 29, 1997

[54] PRECISION MOTION STAGE WITH SINGLE GUIDE BEAM AND FOLLOWER STAGE

[75] Inventors: W. Thomas Novak, Hillsborough, Calif.; Zahirudeen Premji, Boulder, Colo.; Uday G. Nayak, San Jose; Akimitsu Ebihara, San Mateo, both of Calif.

[73] Assignee: Nikon Precision Inc., Belmont, Calif.

[21] Appl. No.: 325,740

[22] Filed: Oct. 19, 1994

[51] Int. Cl.$^6$ .................................. G05G 11/00
[52] U.S. Cl. ................... 74/490.09; 74/490.13; 901/16
[58] Field of Search ............. 74/490.09, 490.07, 74/490.13; 901/16

[56] References Cited

U.S. PATENT DOCUMENTS

| | | | |
|---|---|---|---|
| Re. 27,289 | 2/1972 | Sawyer | 318/38 |
| Re. 27,436 | 7/1972 | Sawyer | 346/29 |
| 3,789,285 | 1/1974 | Nishizawa | 318/687 |
| 3,889,164 | 6/1975 | Nishizawa et al. | 318/640 |
| 3,935,486 | 1/1976 | Nagashima | 310/12 |
| 4,019,109 | 4/1977 | McCoy et al. | 318/640 |
| 4,087,729 | 5/1978 | Yamazaki et al. | 318/601 |
| 4,129,291 | 12/1978 | Kato et al. | 269/73 |
| 4,234,175 | 11/1980 | Sato et al. | 269/73 |
| 4,392,642 | 7/1983 | Chitayat | 269/73 |
| 4,409,860 | 10/1983 | Moriyama et al. | 74/479 |
| 4,425,508 | 1/1984 | Lewis, Jr. et al. | 250/442.1 |
| 4,443,743 | 4/1984 | Forys et al. | 318/115 |
| 4,485,339 | 11/1984 | Trost | 318/640 |
| 4,492,356 | 1/1985 | Taniguchi et al. | 248/346 |
| 4,504,144 | 3/1985 | Trost | 356/150 |
| 4,506,204 | 3/1985 | Galburt | 318/653 |
| 4,506,205 | 3/1985 | Trost et al. | 318/653 |
| 4,507,597 | 3/1985 | Trost | 318/653 |
| 4,514,858 | 4/1985 | Novak | 378/34 |
| 4,516,253 | 5/1985 | Novak | 378/34 |
| 4,525,659 | 6/1985 | Imahashi et al. | 318/649 |
| 4,575,942 | 3/1986 | Moriyama | 33/1 M |
| 4,615,515 | 10/1986 | Suzuta et al. | 269/73 |
| 4,628,238 | 12/1986 | Smulders et al. | 318/653 |
| 4,630,942 | 12/1986 | Tsumaki et al. | 384/8 |

(List continued on next page.)

FOREIGN PATENT DOCUMENTS 63-20014  1/1988  Japan .

OTHER PUBLICATIONS

Moriyama, et al., "Precision X-Y State with a Piezo-driven Fine-table," The Bulletin of The Japan Society Precision Engineering, vol. 22, No. 1, pp. 13-17, Mar. 1988.

Primary Examiner—Charles A. Marmor
Assistant Examiner—David M. Fenstermacher
Attorney, Agent, or Firm—Skjerven, Morrill, MacPherson, Franklin & Friel; Norman R. Klivans

[57] ABSTRACT

An XY stage for precision movement for use in aligning a wafer in a microlithography system. A main stage supporting the wafer straddles a movable beam that is magnetically driven in a first linear direction in the XY plane. A follower stage, mechanically independent of the main stage, also moves in the first linear (X) direction and its motion is electronically synchronized by a control system with the main stage motion in the X direction. Electromagnetic drive motors include magnetic tracks mounted on the follower stage which cooperate with motor coils mounted on the edges of the main stage to move the main stage in a second linear (Y) direction normal to the X direction. Thus the main stage is isolated from mechanical disturbances in the XY plane since there is no mechanical connections and is lightened by removing the weight of the magnetic tracks from the beam. A cable follower stage moves in the Y direction on the follower stage and supports the cables connecting to the main stage, thereby reducing cable drag. An air circulation system is provided in the magnetic tracks on the follower stage to remove heat from operation of the electromagnetic motors. Air is removed from a central region of each track by a vacuum duct enhanced by air plugs fitting at the two ends of the motor coil assembly on the main stage to contain the air therein.

32 Claims, 11 Drawing Sheets

U.S. PATENT DOCUMENTS

| | | | |
|---|---|---|---|
| 4,641,071 | 2/1987 | Tazawa et al. | 318/640 |
| 4,648,723 | 3/1987 | Sugiyama et al. | 384/9 |
| 4,648,724 | 3/1987 | Sugiyama et al. | 384/9 |
| 4,653,408 | 3/1987 | Nagashima et al. | 108/20 |
| 4,654,571 | 3/1987 | Hinds | 318/687 |
| 4,667,139 | 5/1987 | Hirai et al. | 318/687 |
| 4,675,891 | 6/1987 | Plessis et al. | 378/132 |
| 4,677,651 | 6/1987 | Hartl et al. | 378/132 |
| 4,684,315 | 8/1987 | Sugishima et al. | 414/749 |
| 4,687,980 | 8/1987 | Phillips et al. | 318/340 |
| 4,698,575 | 10/1987 | Bouwer | 318/340 |
| 4,708,465 | 11/1987 | Isohata et al. | 355/53 |
| 4,723,086 | 2/1988 | Leibovich et al. | 310/328 |
| 4,742,286 | 5/1988 | Phillips | 318/640 |
| 4,744,675 | 5/1988 | Sakino et al. | 384/12 |
| 4,750,721 | 6/1988 | Sasada | 269/73 |
| 4,770,531 | 9/1988 | Tanaka et al. | 356/358 |
| 4,812,725 | 3/1989 | Chitayat | 318/625 |
| 4,817,930 | 4/1989 | Van Deuren | 269/73 |
| 4,870,668 | 9/1989 | Frankel et al. | 378/34 |
| 4,887,804 | 12/1989 | Ohtsuka | 269/73 |
| 4,916,340 | 4/1990 | Negishi | 310/12 |
| 4,952,858 | 8/1990 | Galburt | 318/647 |
| 4,993,696 | 2/1991 | Furukawa et al. | 269/73 |
| 5,022,619 | 6/1991 | Mamada | 248/178 |
| 5,040,431 | 8/1991 | Sakino et al. | 74/479 |
| 5,059,090 | 10/1991 | Bobroff et al. | 414/749 |
| 5,092,193 | 3/1992 | Yanagisawa | 74/479 |
| 5,120,034 | 6/1992 | Van Engelen et al. | 269/73 |
| 5,150,153 | 9/1992 | Franken et al. | 355/53 |
| 5,228,358 | 7/1993 | Sakino et al. | 74/479 R |
| 5,241,183 | 8/1993 | Kanai et al. | 250/453.11 |
| 5,243,491 | 9/1993 | Van Eijk et al. | 361/144 |
| 5,280,677 | 1/1994 | Kubo et al. | 33/568 |
| 5,285,142 | 2/1994 | Galburt et al. | 318/640 |
| 5,327,060 | 7/1994 | Van Engelen et al. | 318/640 |

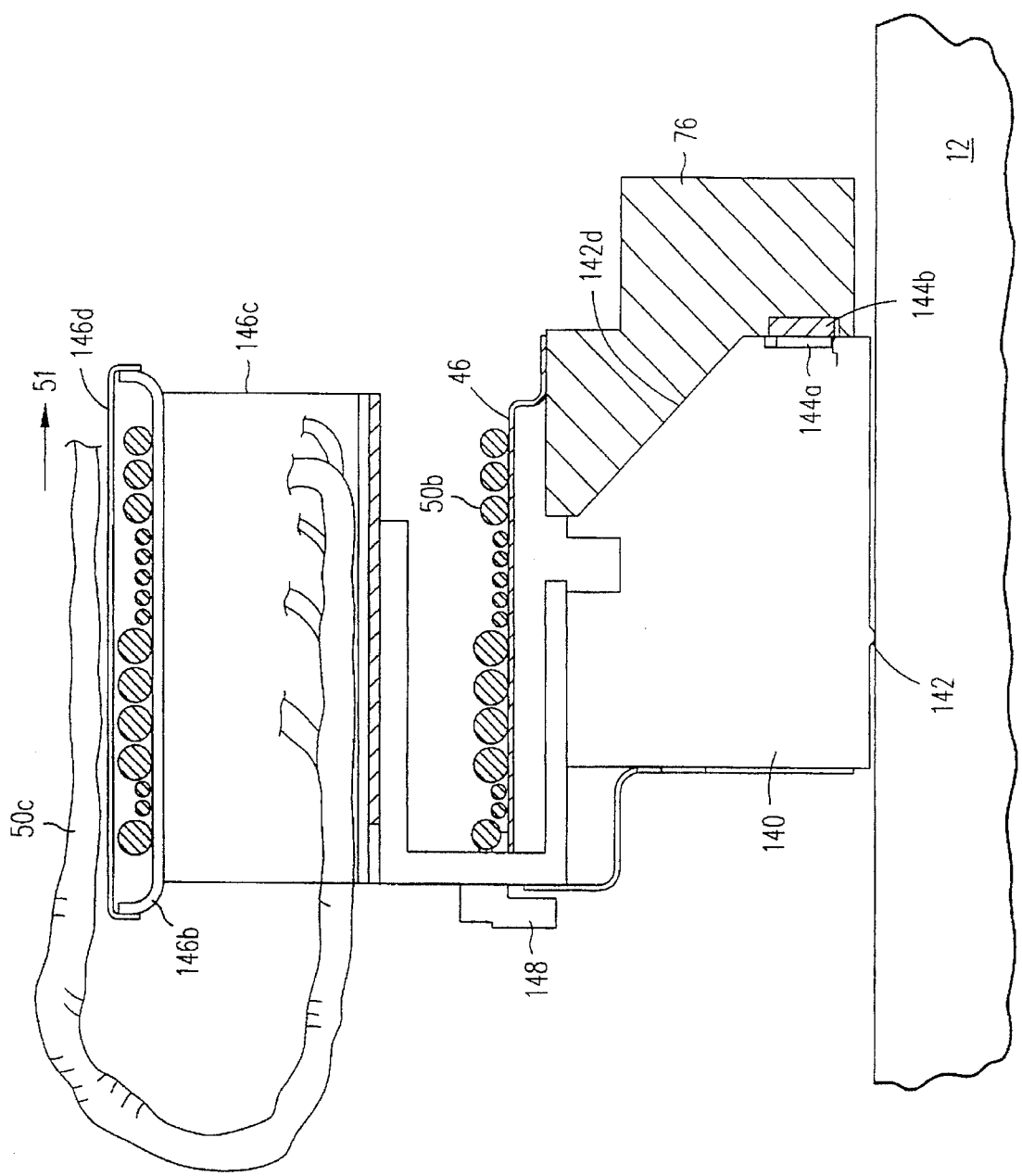

PRECISION MOTION STAGE WITH SINGLE GUIDE BEAM AND FOLLOWER STAGE

BACKGROUND OF THE INVENTION

1. Field of the Invention

This invention relates in general to electromechanical alignment and isolation, and more particularly to a method and apparatus for supporting and aligning a wafer in a microlithographic system having extreme precision.

2. Description of the Prior Art

Various support and positioning structures are well known for use in microlithographic instruments. Typically in the prior art, XY guides including a separate X guide assembly and a Y guide assembly are utilized with one guide assembly mounted on and movable with the other guide assembly. Often a separate wafer stage is mounted on top of the guide assemblies. These structures require high precision in manufacturing and many components. These structures are typically used in a wafer stepper apparatus where the alignment of an exposure field to the reticle being imaged affects the success of the circuit i.e., the yield. In a scanning exposure system, the reticle and wafer move simultaneously and scan across one another during the exposure sequence.

A related system is disclosed in copending and commonly owned U.S. patent application Ser. No. 08/221,375, filed Apr. 1, 1994, titled "Guideless Stage With Isolated Reaction Stage" invented by Martin E. Lee, now U.S. Pat. No. 5,528,118, issued Jun. 18, 1996, and copending and commonly owned U.S. patent application Ser. No. 08/266,999, filed Jun. 27, 1994, titled "Electromagnetic Alignment and Scanning Apparatus", invented by Akimitsu Ebihara now abandoned in favor of U.S. patent application Ser. No. 08/698,827, filed Aug. 16, 1996. See also U.S. Pat. No. 5,040,431 issued Aug. 20, 1991 to Sakino et al. and U.S. Pat. No. 4,667,139 issued May 19, 1987 to Hirai et al. All of the above patent disclosures are incorporated herein by reference. Many other examples of such stage structures, often called "XY stages", are known in the art.

Prior art stages typically suffer from a significant drawback in that the sensitivity of measurement accuracy of the stage position is adversely affected by temperature. The electromagnetic motors which drive the elements of the stage relative to one another are a significant heat source adversely affecting the performance of the laser interferometry typically used to determine the actual stage position.

Another disadvantage of prior art systems is that the numerous cables including electrical cables, fiber optic cables, coolant tubes, vacuum tubes and air hoses connecting to the stage from external devices impose a significant amount of drag and mechanical forces, both steady and impulsive, on the actual stage, thus degrading performance. Thus, cable drag occurs as the stage moves about pulling the cables with it, causing thereby mechanical friction and disturbances.

Additionally, prior art stages suffer from reduced performance due to the relatively high mass of the stage which typically carries the heavy electromagnetic drive motor magnets for positioning the stage in at least one axis direction. Higher mass may reduce the stage mechanical resonance frequency and thereby lower the stage performance. If the stage is made stiffer to compensate, this may add even more mass. Higher mass requires more motor power, thus undesirably more potential for heating.

Therefore, there is a significant problem in the prior art of impeded stage performance in terms of accuracy and speed caused by the relatively high weight of the stage support, the cable drag, and the heat generated by the stage movement impeding sensing accuracy in terms of position.

SUMMARY OF THE INVENTION

In accordance with the invention, an XY stage apparatus is capable of high accuracy positioning and motion control in three dimensions. The apparatus uses linear commutated motors to drive the main stage in a two-dimensional plane and controls out-of-plane linear motion (along the Z axis) as well as rolling and pitching rotations through the use of air bearings.

The main stage in one embodiment straddles a beam (guide bar) that is mechanically driven on a base by linear motors in a first linear direction. A follower stage (follower frame), not mechanically connected to the main stage, also moves independently in the first linear (X) direction between fixed guides mounted on the base, and its motion is synchronized to the main stage motion in the X direction. As the main stage and follower stage move independently but simultaneously in the X direction, linear electromagnetic motors, the magnetic tracks of which are mounted on the follower stage and the coil portions of which are mounted on the main stage, move the main stage in a second linear Y direction normal to the X direction.

Thereby the main stage is isolated from mechanical disturbances in the XY plane and control of accuracy of movement of the main stage is improved by removing the weight of the magnetic tracks from the main stage itself.

Additionally, the sensitivity of measurement accuracy of stage location to temperature effects is improved by minimizing the number and size of heat sources in close proximity to the main stage and the measuring laser beam paths which are part of the interferometry measurement system.

Air circulation is provided through the slots in the magnetic tracks in which the motor coils ride. These slots are partially sealed at either end of the main stage so as to cause air flow through the tracks which is ducted away from the main stage, and thus away from the interferometry laser beam paths.

Additionally, a cable follower stage is mounted on the follower stage. The cable bundle is connected from the main stage to the cable follower stage. The cable follower stage moves in one dimension along the follower stage in synchronization with the movement in that direction of the main stage, and thus supports the bulk of the weight of the cable bundle (including electrical and optical cables, air and vacuum tubes) connected external to the apparatus.

Thus, high accuracy and movement is achieved by obtaining optimum control, minimizing thermal effects, and substantially eliminating cable drag.

The apparatus in accordance with the present invention is suited for use as a wafer stepper and scanner in a scanning exposure system by providing smooth and precise stepping and scanning in two-dimensions. Additionally, the present apparatus is adapted to a scanner system wherein the Y direction is the scan direction and the X direction is the cross scan direction.

Advantageously, precision, accuracy, acceleration, velocity and settling time are improved over the prior art. The main stage and its supporting beam (movable guide bar) are advantageously reduced in weight because the relatively heavy magnetic tracks for driving the stage are mounted on the independent follower stage instead of on the beam. The forces applied to accelerate and decelerate the main stage are effectively applied at or near the center of gravity of the stage. This advantageously reduces torque moment on the stage and thereby reduces a tendency for rolling and pitching of the stage. Thus the control in the X and Y directions is optimized.

Additionally, use of the beam for driving the main stage reduces the number of heat sources located on the stage, thereby reducing thermal effects on the interferometry system which determines stage location. Further use of the follower stage to drive the main stage in the Y direction means that the linear motor coil, often located in the prior art at the center of the main stage, is replaced by two motor coils at two edges of the main stage, each motor coil requiring only one half of the power compared to the use of a single prior art drive motor to achieve similar movement. This not only physically locates the heat source away from the wafer (which is located at the center of the main stage), but also reduces the concentration of heat generated, thereby facilitating a limitation of thermal effects on the stage and on interferometry positioning.

The cable follower stage serves as an intermediate resting place for the cables between the main stage and the external cable connections, the cable follower stage thereby being a mechanical buffer between the main stage and mechanical disturbances due to cable drag. Thus precise movement of the stage is enhanced.

Advantageously, an apparatus in accordance with the invention uses commercially available electromagnetic drive motor components rather than the special commutatorless electromechanical drive elements used in some prior art stages. Thus, the apparatus is relatively easily manufactured and cost is reduced. Further, the heat generated is substantially reduced over that of the prior art commutatorless motors, reducing thermal effects.

The stage need not surround or even straddle the beam, so long as the beam can mechanically drive the stage. In one embodiment, a linear motor coil is located at each end of the beam and drives the beam along magnetic tracks located on the guides elongated in the X direction and fixedly mounted on the base. Thus, the motion of the beam in the X direction (cross scan direction) is transmitted to the main stage because the main stage is coupled to the beam. The beam also serves as a guide for the main stage in the Y direction (scan direction) as the main stage slides freely along the beam via air bearings disposed on surfaces of the main stage facing the beam. The driving motion of the main stage in the Y direction is provided by two linear motor coil assemblies, each mounted on one of two parallel edges of the main stage. The two coil assemblies move inside the magnetic tracks mounted on the follower stage which is located surrounding but mechanically independent of the stage.

The follower stage is a rigid rectangular structure including two parallel members (called herein bridges) that connect two other parallel members at right angles. Two linear motors move the follower stage along the guides in synchronization with the main stage and the beam motion in the X direction.

To ensure smooth sliding motion of the moving members (main stage, beam, follower stage) with respect to the principal surface of the base plate, air (or other fluid) bearings are located underneath the main stage, the beam, and the follower stage. Additional air bearings are also disposed between the follower stage and the fixed guides for smooth follower stage motion in the X direction. Air bearings disposed between the main stage and the beam ensure smooth relative motion of the stage in the Y direction. In one embodiment only one fixed guide is provided, and so the beam and follower frame are guided only at one end.

The follower stage is guided in the X direction and restrained in the Y direction by two opposed pairs of air bearings which clamp to and glide along one of the fixed guides. The beam is guided in the X direction by a combination vacuum and air bearing which moves along the other fixed guide.

Alternatively in another embodiment no air bearings are disposed between the beam and the fixed guides. Instead, air bearings are disposed between the beam and the bridge portions of the follower stage for restraining the beam in the Y direction. Because the beam motion and the follower stage motion are synchronized in their respective X direction movements by an electronic control system, relative motion (only a few millimeters) is limited between the beam and the follower stage and only arises from the lack of perfect synchronicity in the control system between these two elements. Thus bearing mechanical noise at this location is minimized.

"Air plug" structures and corresponding air ducts improve heat removal from the linear motors that drive the stage in the Y direction along the beam. The slots which accommodate the magnetic tracks on the follower stage are closed at each corner of the main stage by air plug structures so as to contain the warm air inside. These air plugs are formed in the shape of the interior portion of the slot in cross section and have a similar clearance to that of the motor coil relative to the magnetic track. Thus there is a small gap between the air plug structures and the magnetic track interior. Thus the air plug structures do not completely seal the air movement in the slots, but form sufficient restriction between the air inside the slots and outside to allow a slight negative pressure to develop. This ensures, in conjunction with a ducted vacuum outlet located in a center portion of the magnetic track, the controlled flow of air from the outside moving into the stage motor coil slots. This air in turn is removed by the ducts. Duct tubing is attached to the outlet in the magnetic track assembly to circulate air therethrough to cool the coil assemblies at its center portion.

BRIEF DESCRIPTION OF THE DRAWINGS

FIG. 2a shows a view of the wafer stage and beam of FIG. 1a.

FIG. 2b shows the underside of the wafer stage and beam of FIG. 2a.

FIG. 3c shows detail of a cross section of the cable follower stage.

FIG. 4 shows a cross section of the stage, beam and heat dissipation structures of FIG. 1a.

FIG. 5 shows a block diagram of a control system for the XY stage of FIG. 1a.

DETAILED DESCRIPTION OF THE INVENTION

Figure 1A:
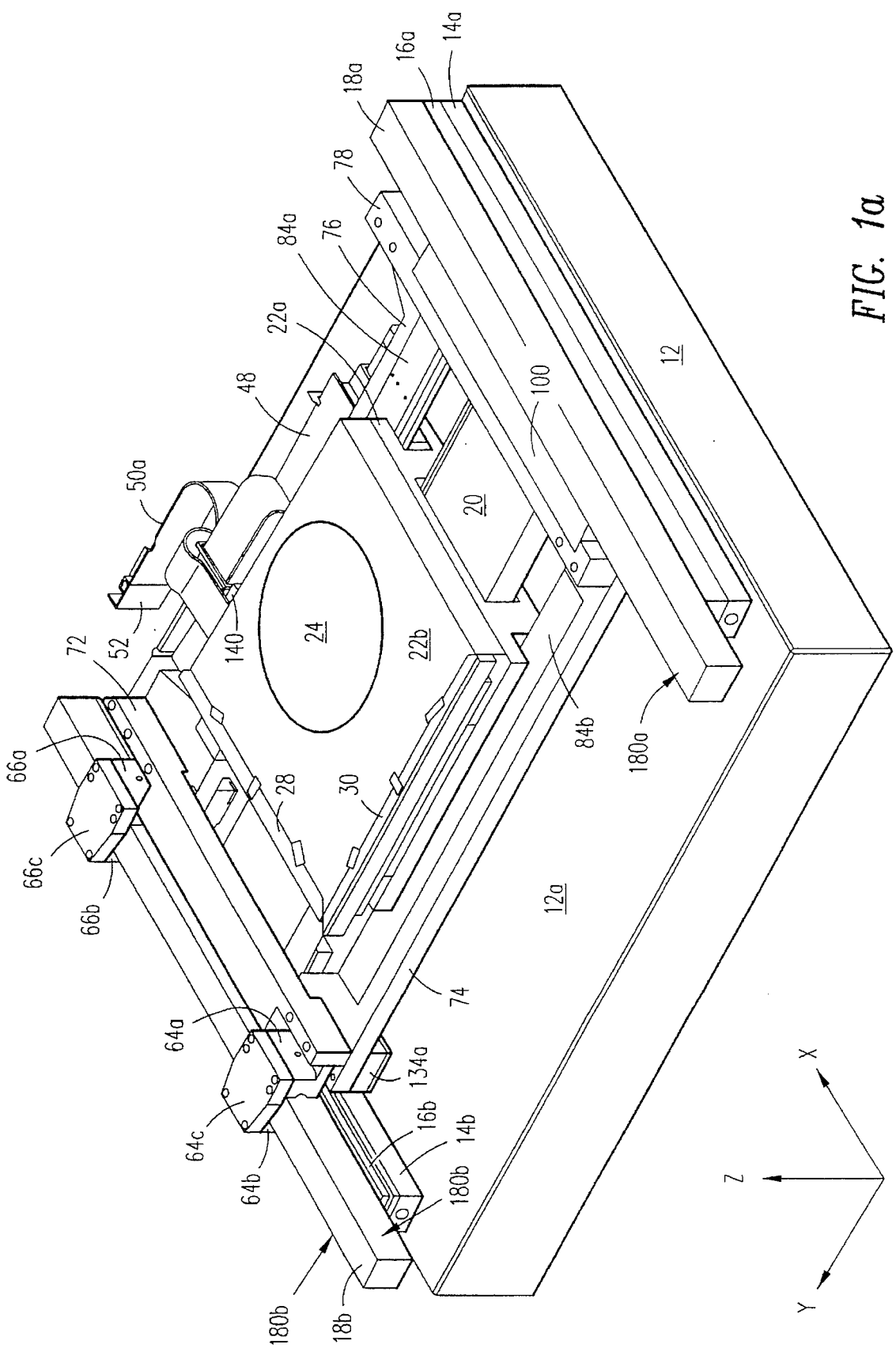
FIG. 1a shows a perspective view of an XY stage structure in accordance with the present invention.

FIG. 1a shows a perspective view of an XY stage structure in accordance with one embodiment of the invention. (Axes X, Y, Z are shown for purposes of illustration but are not structural elements.) Granite base 12 having flat and smooth principal surface 12a is a conventional base for stability. Two fixed granite guides 18a and 18b which are spaced apart in the Y direction and parallel are mounted on the surface 12a of base 12.

Each of the guides 18a, 18b is almost orthogonal to the surface 12a (X-Y surface) and has guiding surfaces 180a, 180b in the X direction. The guiding surface 180a of the guide 18a guides the air bearing/vacuum structure 100 that is fixed to one end of the beam 20 so as to move the beam (movable guide bar) 20 in the X direction. A guiding surface in the Y direction is formed on the side surface of the beam 20, and the main stage (upper and lower stages 22a, 22b) is movable in the Y direction along that guiding surface. Magnetic tracks 16a, 16b are mounted on the base 12 via spacers 14a, 14b respectively, and the guides 18a, 18b are disposed above magnetic tracks 16a, 16b respectively. The spacers 14a, 14b are formed into a square/rectangle pillar shape in the X direction respectively and also provide internal cooling ducts to extract warm air from the vicinity of the magnetic tracks 16a, 16b. In the slot in the X direction of the magnetic tracks 16a, a coil unit that is fixed at the lower part of the structure 100 on one end of the beam 20, is inserted. Similarly, a coil unit that is fixed on the other end of the beam 20, is inserted in the slot in the X direction of the magnetic tracks 16b. Only one of these coil units could be mounted (preferably on the structure 100 side) in one embodiment.

These coil units and the slots for each of magnetic tracks 16a, 16b are disposed in the Y and Z direction so as not to contact each other, and the beam 20 moves on the surface 12a of base 12 in the X direction by providing an electric current to the coil units. As described later in detail, air bearings are installed at the lower part of the both ends of beam 20, and the weight of the beam 20, structure 100, and coil unit is borne by the surface 12a. The lower stage 22a surrounds the beam 20 and is supported on the surface 12a via air bearings. Therefore, the weight of the main stage does not fall on the beam 20 but entirely on the base 12.

On the other hand, guide 18b guides the movement of the follower stage assembly (72, 74, 76, 78) which has a rectangle frame structure in the X direction. Inside the frame of this follower stage assembly, there is space to accommodate the Y direction stroke of the main stage movement. As described later in detail, the follower stage assembly is supported on the base 12 via air bearings and has a coil unit that is magnetically connected with the magnetic track 16b. This coil unit is installed on the bridge structure 72 side in FIG. 1a and moves the follower stage assembly in the X direction. Furthermore, the bridge structure 78 in FIG. 1a is disposed leaving a gap of several mm with the air bearing/vacuum structure 100 so as to avoid contact. Furthermore, in the present embodiment, the follower stage assembly is guided only by the guide 18b, and there is no restraint by the guide 17a in the Y direction.

Magnetic tracks 16a and 16b are of the "300 series" available from Trilogy Corporation, Webster, Tex., and are a first part of the conventional electromagnetic drive motors, as described below. The inner motor coil assemblies which are in one embodiment also the second part of the drive motors are commercially available parts. These are commutated linear motors, part number LM310-3 from Trilogy Corporation. (This particular motor is approximately three times as powerful as is needed; this overdesign is intentional so that the motor coils operate well under their capacity, to minimize heat production.) The wires which comprise the coil windings are very fine and embedded in a material such as epoxy. Each coil includes three sets of windings, each winding spaced one-third of the magnetic pitch as defined by the magnetic tracks from one another. The magnetic tracks are a linear assembly of magnets, for instance pairs of individual magnets mounted to an iron frame with an air gap between. The pairs are installed adjacent with their poles reversed for each adjacent pair of magnets. This set of magnets is magnetically attached to the iron or steel backing structure and held in place by adhesive. The magnetic tracks may be of various configurations. In one configuration, the coil moves between two opposed sets of magnets. In another embodiment, a coil having two spaced-apart portions is located above and below a magnetic track.

The beam 20 is a rigid structure rectangular in cross section of the X-Z plane and formed for instance of ceramic (e.g. alumina) or aluminum. In another embodiment, the beam 20 is an I bar shape in cross-section. The beam 20 defines internal voids (see FIG. 4) so as to minimize its weight, and includes damping features.

Lower stage 22a straddles and surrounds guide bar 20. The lower stage 22a is for instance of aluminum or ceramic material (silicon carbide). The upper stage 22b made of ceramic is mounted on lower stage 22a. Also a conventional wafer chuck 24 made of ceramic and two mirrors 28, 30 for laser interferometer are mounted on upper stage 22b. The mirror 28 reflects the y interferometer beam that measures the stage 22b position in the Y direction, and the mirror 30 reflects the x interferometer beam that measures the stage 22b position in the X direction. It is to be understood that typically in use, the stage 22b is covered by a rectangular cover with openings for the conventional chuck, mirrors, sensors, and other fixtures (not shown) as appropriate.

The XY stage depicted herein is for lithography on semiconductor wafers. However, the invention is not limited to this application. To give an idea of the relative dimensions involved, in this case wafer chuck 24 is of a size to accommodate a 12 inch diameter semiconductor wafer. Thus the overall dimensions of base 12 are approximately 4½'× 4½'. In one embodiment, leveling devices (also not shown) are provided for leveling the upper stage 22b relative to the lower stage 22a. Also conventional structures (not shown) are mounted on upper stage 22b for adjusting the rotation of wafer chuck 24. Fiducial marks are mounted on upper stage 22b, as are conventional interferometry mirrors 28 and 30 for determining the stage position as described hereinafter. Lower stage 22a rides on the principal surface 12a of the base 12.

The follower stage is a rigid rectangular structure including four e.g. aluminum members. These are opposing and parallel members 74 and 76 located on either side of and lying parallel to the beam 20 and connected by opposing and parallel "bridge" members 72 and 78.

The cable bundle 50a with cable connector 52 is supported on a cable follower stage 140 mounted on follower frame member 78 (shown better in other views). Magnetic tracks 84a and 84b are fixed to respectively follower stage members 76 and 74 and form a part of the follower stage. In each of the slots of the magnetic tracks 84a, 84b, coil units that are fixed to both sides of the lower stage 22a are inserted. These coil units energize the main stage to be moved in the Y direction. The follower stage also includes air bearing members 64a and 64b which are located on either side guide surface 180b of upper guide 18b and are connected by connecting member 64c. Similarly, air bearing members 66a and 66b are located on either side of upper guide 18b and are connected by connecting member 66c. Thus, members 64a, 64b, 64c and 66a, 66b, and 66c guide the follower stage along upper guide 18b. An air bearing 134a (and others, not shown here) also guide the follower stage on principal surface 12a as described in further detail below.

As evident from the above described structure, the counter force generated by acceleration and deceleration of the main stage in the Y direction is entirely transmitted to the guide 18b via bearing members 64a, 64b, 66a, 66b. In other words, this counter force is not transmitted to the other guide 18a at all via the beam 20 that guides the main stage and the air bearing/vacuum.

The air bearings are of a type available from Devett Machinery Co., Aston, Pa. The air bearings are of three general types each providing a typical riding height of 5 microns. One type is a combination vacuum/air bearing. The air bearing is formed of a porous carbon body with a varnish sealant along its non-bearing sides. The carbon body defines a central bore which is connected to a source of vacuum. The outer perimeter of the carbon body is the air bearing. The upper portion of the carbon body is connected to a source of compressed air. Thus, the compressed air is pushed out through the carbon body at its concentric outer portion and the vacuum sucks in the air at the center portion, thus providing a proper supporting effect whereby the vacuum "loads" the air bearing.

In a second air bearing/vacuum structure used herein, the vacuum portion is physically separated from and adjacent to the air bearing portion. It is to be understood that the vacuum and compressed air are provided externally via tubing in the cable bundle and an internal tubing distribution system (not shown in the figures for simplicity).

The air bearing clamping structures 64a, 64b, 64c and a similar structure 66a, 66b and 66c are of a third type and provide the desired low friction relationship between the upper guide 18b and the follower stage member 72. These are conventional air bearing clamping members with opposed air bearings 64a and 64b connected by a connecting member 64c. This type of clamping air bearing structure is relatively bulky and hence is not used in other portions of the structure, where instead the air bearing/vacuum combinations are used. However, it is to be understood that where space permits this type of clamping air bearing structure and other types of air bearing structures may be substituted for the air bearing/vacuum combination bearing structures illustrated herein. In general, it is to be understood that air bearings must be loaded, either by a weight, by a physical clamping structure, or by vacuum, to perform properly.

FIGS. 1b, 2a, 2b, 3a, and 3b are other views of either the entire structure of FIG. 1a or portions thereof.

Figure 1B:
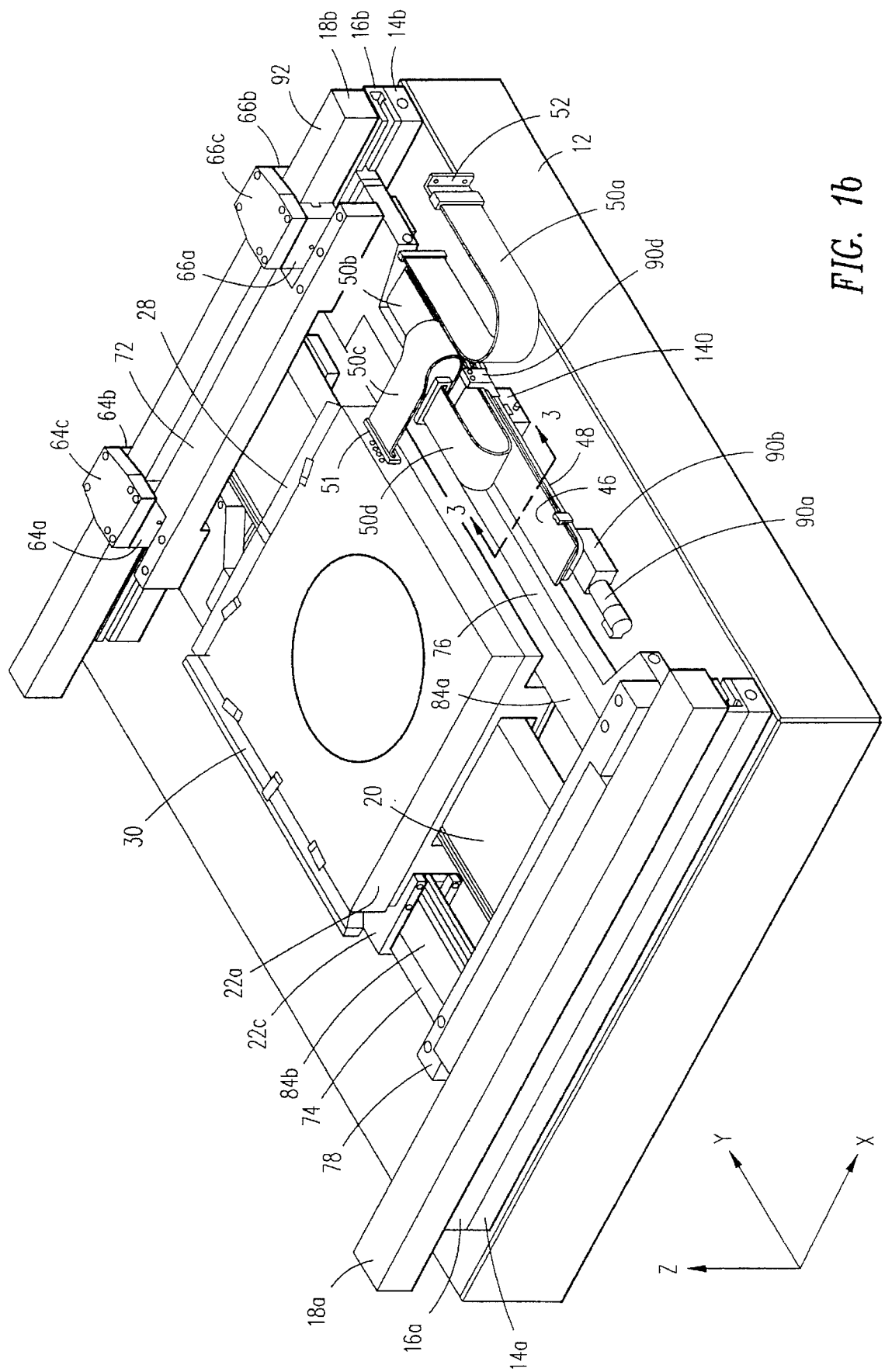
FIG. 1b shows a view of the structure of FIG. 1a rotated 90°.

FIG. 1b shows the identical structure of FIG. 1a rotated 90° clockwise so as to better illustrate the portion which is to the rear of FIG. 1a. Thus, additionally in FIG. 1b are seen the other portions of the cable bundle assembly including the additional cable bundle loops 50b, 50c, and 50d and the terminus 52 of the cable bundle loop 50c which connects to the upper stage 22b. A preload type air bearing system (not visible) supports the cable follower stage 140 with respect to the surface 12a of the base 12 and outer side face of the member 76 of the follower assembly. It is to be appreciated that the cable bundle includes electrical wires, optical fibers, vacuum tubes, fluid coolant tubes, and pneumatic tubes for carrying compressed air for the air bearings. The cable bundle is attached to the cable follower stage 140 by stage connector 90d and is moved by a steel band 48 which is driven by a rotary drive motor 90a via gear mechanism 90b. Plate 46 is located over steel band 48 for purposes of supporting cable 50d as it rolls out onto the plate 46. Thus, the cable follower stage 140 is mounted on and moves relative to member 76 of the follower stage in the X-direction. The cable follower stage moves the cable bundle attached to connector 90d to the left and right directions (Y direction) in FIG. 1b in synchronization with the movement of the main stage. Thus, the cable dragging effect on the main stage is eliminated.

With regard to the cable bundle, its operation is such that as shown in FIG. 1b, the loop 50a widens and narrows with the movement of the follower stage elements (72, 74, 76, 78, and 140) along its axis in the X direction. The loop 50d also rolls to extend and shorten as the cable follower stage 140 moves in the orthogonal direction i.e., the Y direction with the main stage by actuating the motor 90a and gear mechanism 90b which are fixedly attached to the member 76 without contact to the base surface 12a. Thus all of the cable movement is in the main loops 50a and 50d, the other cable loop 50c being essentially stationary with only minimal movement, i.e., approximately one or two millimeters, which is the maximum movement between the cable follower stage and the main stage.

As further seen in FIG. 1b, the magnetic track 84b is identical to magnetic track 84a including an internal slot for accommodating the motor coil attached to lower stage 22a as described further below. The other elements shown in FIG. 1b are identical to those in FIG. 1a. (Not every element shown in FIG. 1a is also referenced in FIG. 1b, for simplicity.)

Although not shown in FIG. 1a, a coil unit 92 to be inserted in the slot for the fixed magnetic track 16b is shown in FIG. 1b at the end part on the guide 18b side of the follower stage assembly. It is preferable to install this coil unit 92 not only on one end side of the member 75 in the Y direction (clamping assembly 66a, 66b, and 66c) that constitutes the follower stage assembly but also on one end of the follower stage assembly member 74 (claiming assembly 64a, 64b, 64c side).

Figure 2A:
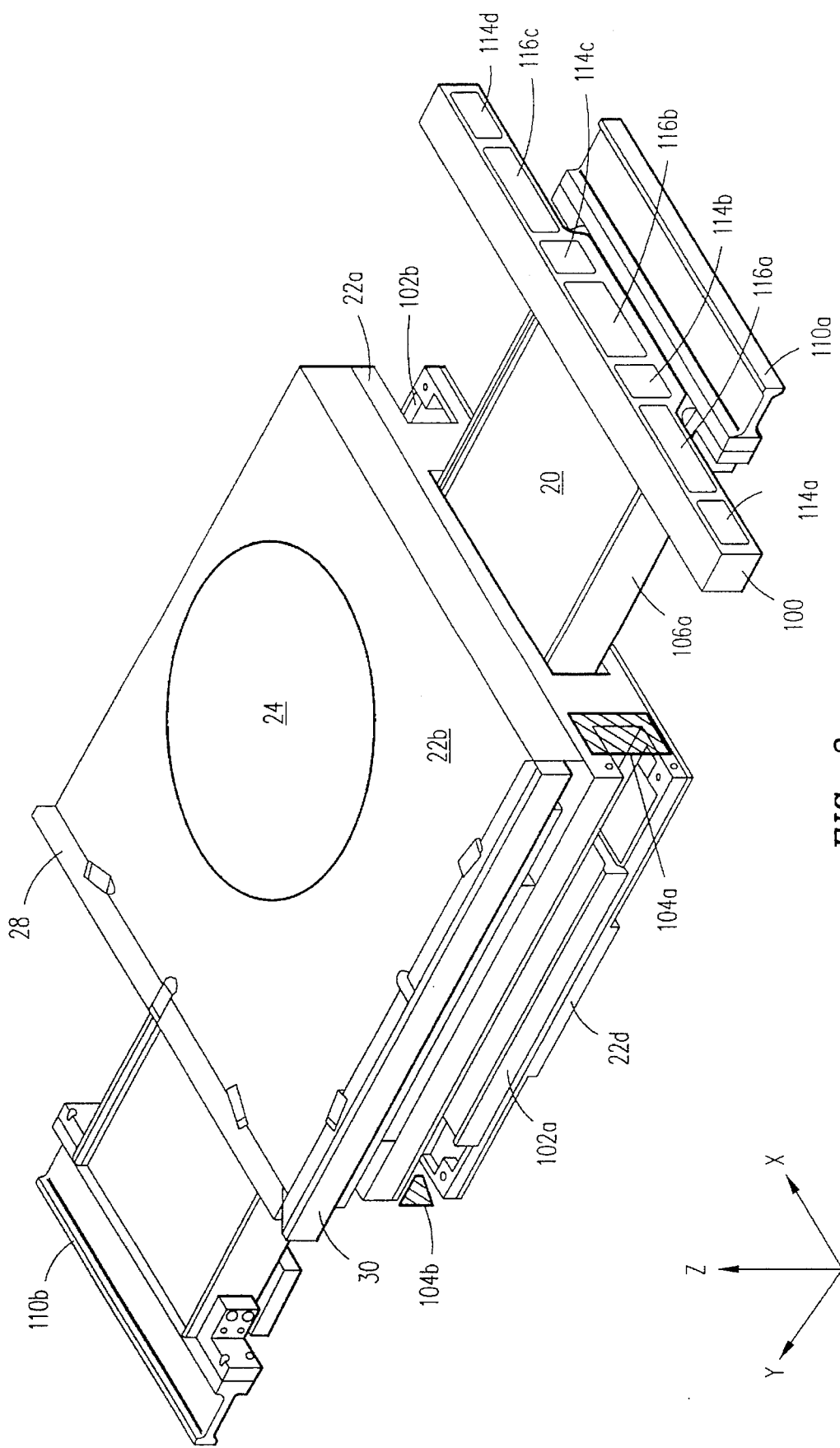

FIG. 2a shows portions of the structure of FIG. 1a, from an identical perspective. However, the base 12 and the associated fixed guides and the follower stage are not illustrated in FIG. 2a so as to better show the beam structure 20 and the lower stage 22a.

As shown in FIG. 2a, a vacuum/air bearing structure 100 is attached to the right end of beam 20. Air bearings 114a, 114b, and 114c and 114d as well as vacuum areas 116a, 116b, and 116c are mounted on structure 100. (The air bearing structure 100 is also partly shown in FIG. 1a but only its top portion is visible in FIG. 1a.) As shown in FIG. 2a, air bearing structure 100 is mounted so that each of the air bearings (pressure gas exhaust pads) and vacuum areas faces the side guide surface 180a of the fixed guide 18a on an upper surface of beam 20. The X direction motor coil 110a is mounted on the end portion of beam 20 and the X direction length of the structure 100 is almost equivalent to the dimension of the main stage in the X direction. As shown, motor coil 110a is an I shaped structure in cross section. A similar motor coil 110b (also for movement in the X direction) is mounted on the left hand portion of beam 20.

The motor coils 110a, 110b are attached by brackets as shown to the main portion of the beam 20.

FIG. 2a shows at the left hand portion of lower stage 22a the Y direction motor coil 102a which is mounted on lower stage 22a. The structure of motor coil 102a is similar to that of motor coils 110a and 110b. At the right hand side of lower stage 22a, a small portion of the other stage motor coil 102b is visible. It is to be understood that motor coils 102a and 102b fit into the corresponding magnetic tracks 84a and 84b respectively on the follower stage shown in FIGS. 1a and 1b. Hence, the "T" shape of motor coils 102a and 102b in cross section fits into the corresponding slots of magnetic tracks 84a and 84b. The underside portion 22d of lower stage 22a is an air bearing pad assembly described in further detail below. Also shown in FIG. 2a is guide surface 106a at the left hand side of beam 20. This guide surface 106a is in contact with an air bearing pad assembly fixedly mounted on the corresponding inner surface of lower stage 22a. A similar guide surface on the opposite side of beam 20 is not visible in FIG. 2a.

FIG. 2a also shows "air plug" structures 104a, 104b located at either end of the side slot portion in lower stage 22a accommodating motor coil 102a. Such air plugs are not provided for motor coil 102b in this embodiment, but may be used for motor coil 102b, as described below.

Figure 2B:
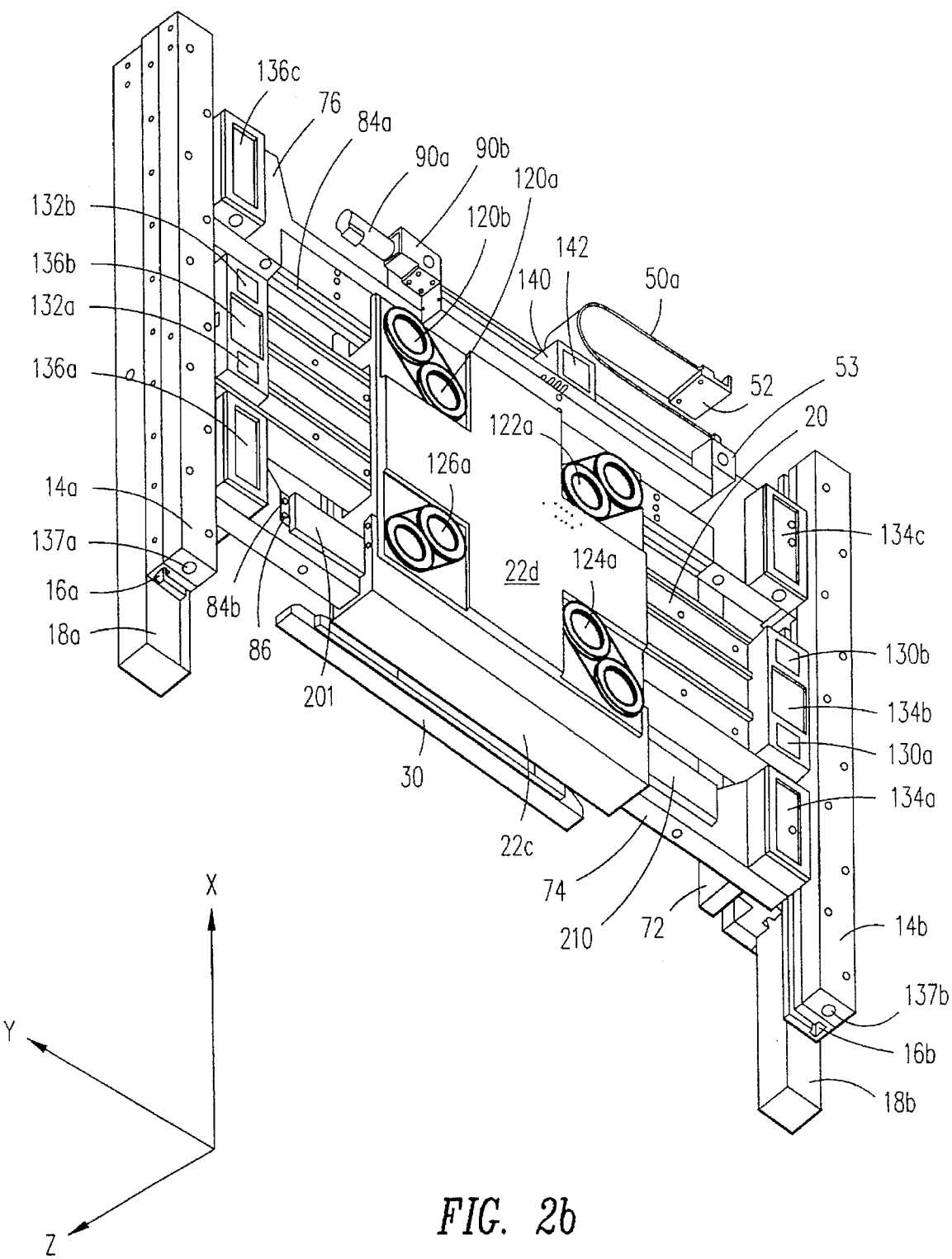

FIG. 2b shows the underside of stage 22a including an (aluminum) plate 22d on which four pairs of air bearing/vacuum structures are mounted at each corner portion of the plate 22d. The first pair of pads 120a, 120b each includes a circular central portion which is a vacuum inlet and an outer concentric portion which is the air bearing portion, as described in detail below. Similar structures are shown at the other corners of the plate 22d, including air bearings/vacuum structures 126a, 124a, and 122a. (The other air bearings are not designated here for simplicity.) Also visible in FIG. 2b is the underside of beam 20, cable bundle loop 50a and the air bearing 142 which supports the cable follower stage 140. One end of the cable bundle 50a is connected to a terminus connector 52 (fixed, for example, on the base 12 side), and the other end is connected to the connector 53 that is fixed to the side end of the frame member 76 of the follower stage assembly.

It is to be understood that in FIG. 2b only the base 12 is removed; all other structures are shown, including the guides and magnetic tracks 16a, 18a, and 16b and 18b. Also, the under portion of the follower stage including members 72 and 76 is illustrated. Also shown are the air bearing and vacuum structures on the underside of beam 20. These are, at the left hand side of beam 20, vacuum area 136b and air bearings pads 132a and 132b which are arranged adjacent to both sides of the vacuum area 136b with respect to the X direction. At the right hand side of beam 20 are shown vacuum area 134b and the corresponding air bearings 130a and 130b.

Also shown are the air bearing/vacuum structures for supporting the follower frame members 72 and 76 on surface 12a and mounted on the underside of the members 72 and 76. At the left hand portion of member 76, the rectangular vacuum area at the center portion of structure 136c is surrounded by the concentric air bearing (pressurized gas exhaust) portion. Corresponding air bearing vacuum structure 134c is located at the right hand side of follower stage member 76. Similar pad structures 134a, 136a are mounted on member 72. Also illustrated are the magnetic tracks 84a and 84b mounted on the follower stage members respectively 76 and 72. A cover (heat baffle) 22c attached to one side of lower stage 22a encloses a portion of the magnetic track 84b and the follower stage, as described below. The underside of the heat baffle 22c (partly shown in FIG. 1b) is shown, as is heat extraction duct 201 (described further below). Also shown is the interferometry mirror 30 and portions 90a and 90b of the cable follower stage drive mechanism, and air bearing 142 on the bottom surface of cable follower stage 140. Round holes 137a, 137b respectively in spacers 14a, 14b are ducts to extract heat from the magnetic tracks 16a, 16b. Air hoses (not shown) are attached to holes 137a, 137b. Duct 86 is a hole into the interior of magnetic track 84b; an exhaust (vacuum) air hose is attached thereto (but not shown) to remove warm air from inside track 84b.

The inside of the spacers 14a, 14b is formed to be a cavity, and on the steel cover of the magnetic tracks 16a, 16b holes that lead to the cavity of the spacers are formed spaced apart in the longitudinal direction. Therefore, if the air extracting hoses are connected to the each of the holes 137a, 137b in the spacers 14a, 14b, warm air floating in the slots of each of the magnetic tracks 16a, 16b is forcibly exhausted. Such a structure makes it possible to prevent the warm air in the slot, that has been warmed up by the heat generated by coils 110a, 110b that are magnetically connected to each of the magnetic tracks 16a, 16b from flowing out to the surrounding portions of the main stage.

Figure 3A:
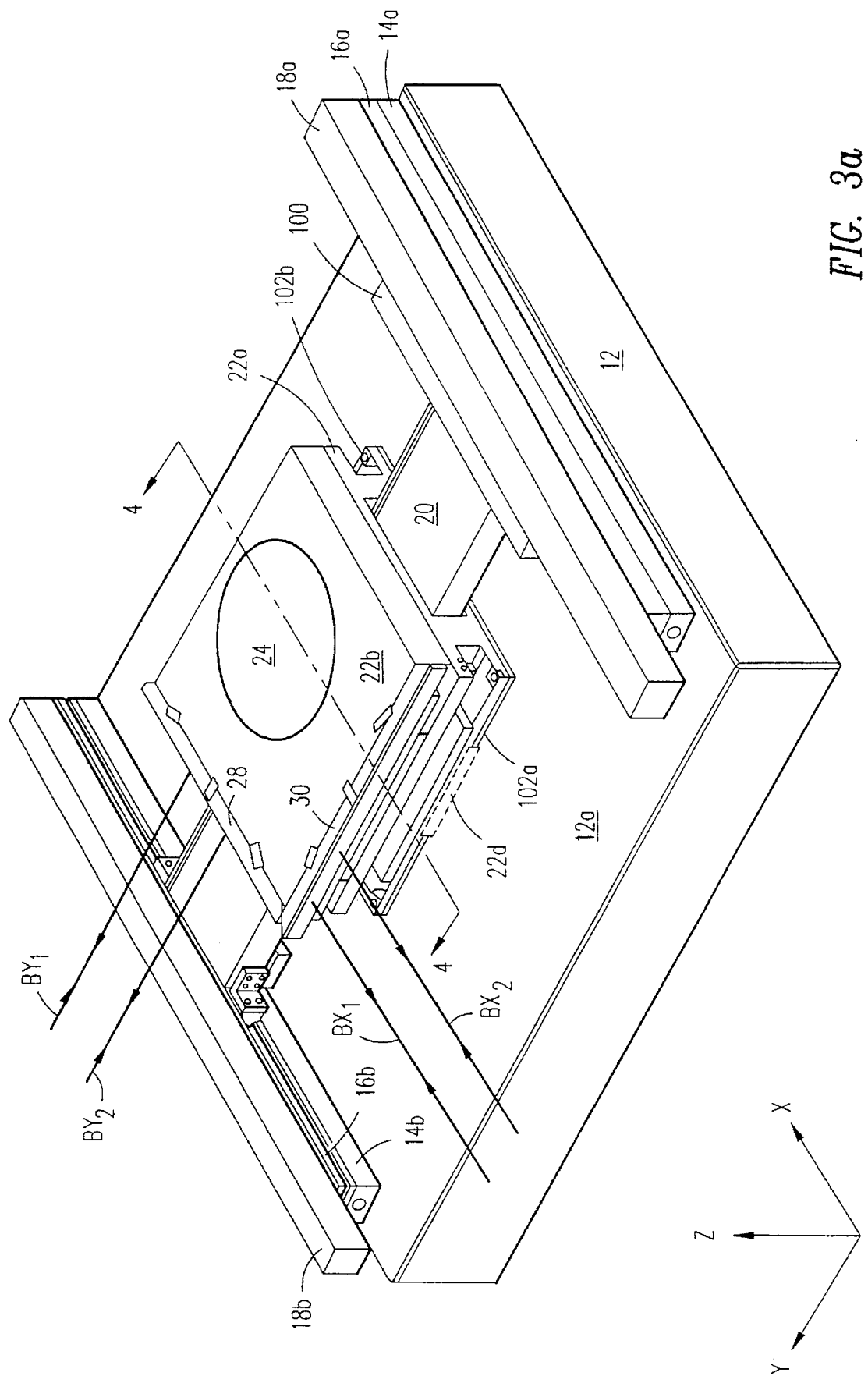
FIG. 3a shows the wafer stage and base of FIG. 1a, without the follower stage and associated structures.
Figure 3B:
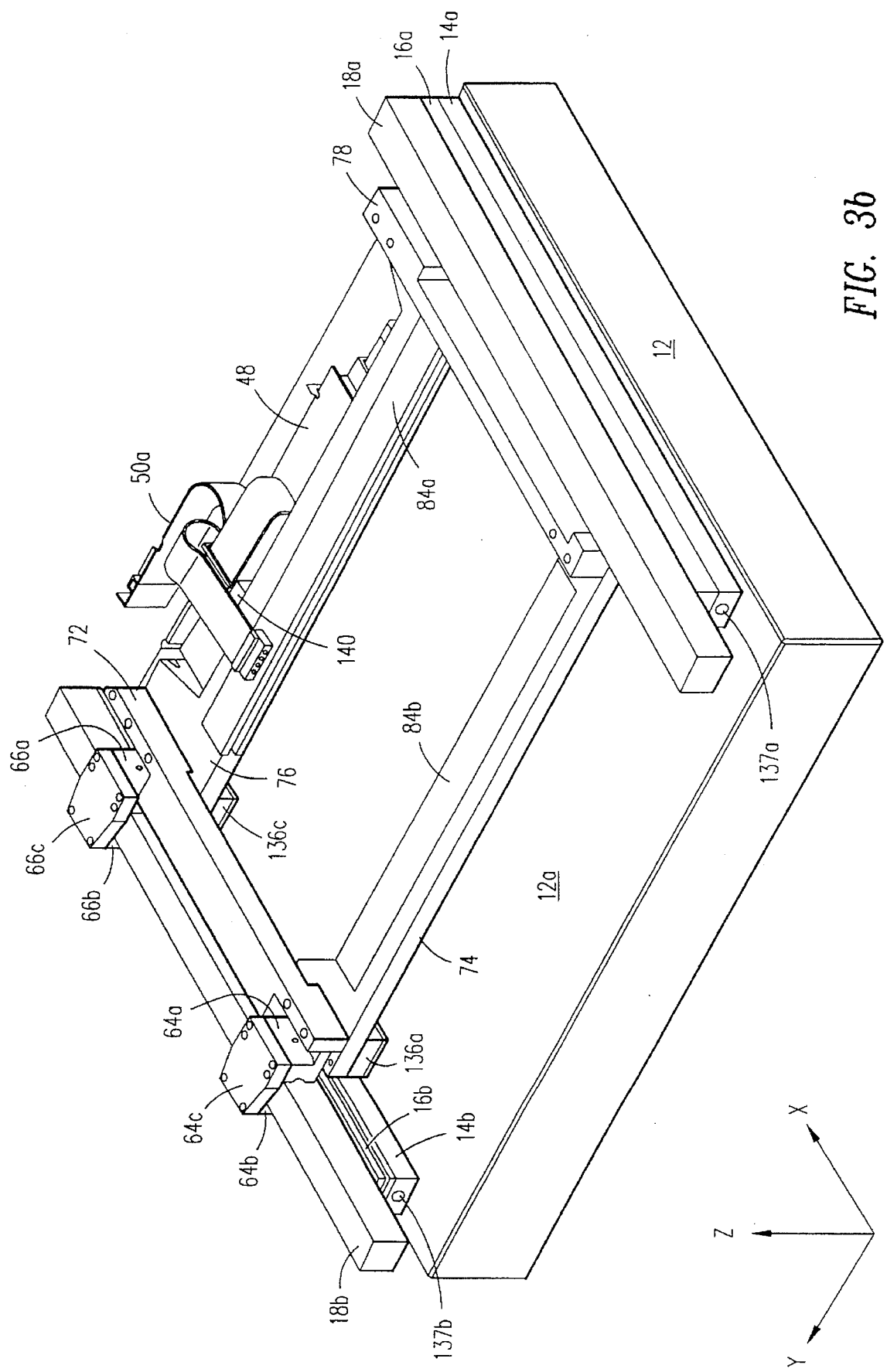
FIG. 3b shows the follower stage and cable follower stage and base of FIG. 1a, without the beam or main stage.

FIG. 3a illustrates the base 12, the beam 20, the lower stage 22a and upper stage 22b and associated structures with the follower stage shown removed. FIG. 3a shows how the wafer stage of FIG. 2a is located on the principal surface 12a of the base 12. FIG. 3b shows the base 12 and the follower stage assembly (72, 74, 76, 78, 64a–64c, 66a–66c, 136a, 136c, etc.) and cable follower stage (140, 148, etc.) without the main stage and the beam. Thus, all the structures illustrated in FIG. 3b are also illustrated in the foregoing figures.

As evident from the main stage structure shown in FIG. 3a, because linear motor coils 110a and 110b are installed at both ends of the beam 20, the beam 20 can be finely rotated in the X-Y plane by controlling the current (e.g., three-phase current) that drives the coils 110a and 110b. This enables active adjustment of the yawing of the main stage (22a, 22b). Similarly, it is also possible to finely rotate the main stage together with the beam 20 in the X-Y plane by controlling the driving current to the two coils 102a and 102b installed on the both sides of the lower stage 22a.

If an interferometer that measures the position of the mirror 28 in the Y direction has measuring laser beams BY1, BY2 of two axes or more, for instance, then the main stage yawing can be determined by obtaining the difference between the measurement values taken by the beams BY1 and BY2. Similarly, the X interferometer for the mirror 30 can be a multi-axis (laser beam BX1, BX2) type.

Incidentally, the counter force (acceleration and deceleration) generated accompanying the Y direction movement of the main stage is not transmitted to the beam 20 at all. Because of this, the stiffness of the static pressure gas bearing that is formed in the gap (a few micrometers) between the air bearing/vacuum structure 100 that restrains the beam 20 in the Y direction and the guide surface 180a of the guide 18a can be small. Thus the regulation for the air pressure or vacuum pressure that is supplied to the air bearing/vacuum structure 100 can be relaxed.

The relaxation of this stiffness constraint also implies that the positioning and the movement accuracy (stability at the time of acceleration and deceleration in the Y direction) of the main stage will not deteriorate as a result. On the other hand, the principal function of the follower stage assembly (follower frame) shown in FIG. 3b is to have the magnetic tracks 84a, 84b of the linear motor that drives the main stage (22a, 22b) follow the main stage and to move them in the X direction. Furthermore, another principal function is to transmit the counter force generated at the time of the main stage movement in the Y direction to the fixed guide 18b via the clamping structures 64a–64c, 66a–66c. Because of this, the clamping structures 64a–64c, 66a–66c are connected to the guide 18b via a supporting structure where high stiffness can be obtained so as to firmly restrain the entire follower stage assembly in the Y direction.

In one embodiment of the invention, small elastic bumpers (not shown) are affixed to the principal surface 12a of granite base 12 along its edges (other than the edges where the guides are located). These bumper cushion the movement of the stage in case of a failure of the control system causing the stage to move to the very edge of the surface 12a.

As seen in FIG. 1b, a motor coil 92 is mounted on the right hand portion of follower frame member 76. A corresponding motor coil (not shown) is mounted on the left hand portion of follower frame motor 76. This coil is inserted in the slot of the fixed magnetic track 16a and drives the follower stage assembly in the X direction in cooperation with the coil 92 shown in FIG. 1b. These motor coils provide the driving force for the follower stage and are similar to but shorter in length and hence lower in power than the motor coils 102a, 102b of the main stage, due to the lower mass of the follower stage. In the embodiment, the opposing follower stage member 74 does not include any drive motor coils.

Comparison of FIGS. 3a and 3b shows how both beam 20 and the follower stage 76 member are driven on the identical magnetic tracks 16a and 16b. Also, comparison of these figures shows how the follower stage rides against the guide 18b while the beam 20 rides against the guide 18a. A comparison of FIGS. 3a, 3b also illustrates the purpose of the bridge structure of follower stage members 72, 78.

Thus when the coils 102a, 102b on the stage 22b are energized, the stage 22a generates force (in the Y axis direction) in proportion to the magnetic strength of the follower stage magnetic tracks. Thus the reaction force (in the Y axis direction) accompanying the main stage movement is all imparted to the follower stage. Therefore, since no reaction force is provided to the beam 20 which guides the main stage, no such force that would deflect the guiding surface affects the fixed guide 18a. The other guide 18b bears the reaction force of the follower stage, and the guide 18b may be deflected thereby. However, the deflection would only affect the follower stage guiding accuracy, and thus desirably the main stage guiding accuracy is not adversely affected.

It is also to be understood that the particular configuration of the air bearings shown herein is only illustrative of one embodiment of the invention. For instance, the circular air bearing/vacuum structures 120a, 120b, etc. shown in FIG. 2b are used, but the rectangular type vacuum and air bearing structures also shown in FIG. 2b could be used. Also, the concentric combination air bearing/vacuum structures such as 126a and 136c for example, are used in places but the separated vacuum structure/air bearing structure such as 132b and 136b could be used. The selection of a particular air bearing configuration depends on the geometry of the available surface area.

FIG. 3c shows a cross section along line 3—3 in FIG. 1b, thereby illustrating details of the cable follower stage and associated structures. Elements shown in FIG. 3c which are identical to those in FIG. 1B are the base 12, the cable follower stage 140, the outer side portion of the follower stage member 76, one surface of which is slanted at about 45° and bears up against the cable follower stage 140 and thereby serves as a guide therefore, and the air bearing 142 (shown in FIG. 2b also) which bears on base 12. Additional structure shown in FIG. 3c includes a magnet 144a mounted on cable follower stage 140 which is attracted to iron plate 144b installed in the (aluminum) follower member 76. The iron plate 144b is elongated in the X direction over the stroke of the cable follower stage 140. Magnet 144a serves to load air bearings 142d, 142 located on two of the surfaces of cable follower stage 140, due to the attraction between magnet 144a and iron plate 144b mounted on the corresponding surface of member 76. Therefore, the cable follower stage 140 is guided by the 45° slanted surface (formed in the X direction) of the member 76 and moves in the X direction (the direction perpendicular to the paper on which FIG. 3c is drawn).

Other elements shown in FIG. 3c include photodetector 148 which detects the cable follower stage movement limit. Also included are steel plate 46 upon which a loop of the cable bundle 50b is supported, and cable clamp members 146b, 146d between which the end portion of the cable bundle 50b, that is the bundle 50d, is located, and structural member 146c for supporting cable clamp members 146b and 146d. (It is to be understood that the cable bundle as shown in FIG. 1b is looped around and folded several times on structures 146b, 146c, 146d.)

The steel plate 46 shown in FIG. 3c (and FIG. 1b) is fixed in the X direction on the member 76 side so as to cover the upper part of the cable follower stage 140. The structures 146b, 146c, 146d move in the space above the steel plate 46 in the Y direction (the direction perpendicular to the paper on which FIG. 3c is drawn) altogether with the stage 140.

The end portion of the bundle 50 on the supply source side is connected to the terminus connector 53 (shown in FIG. 2b) that is fixed on the member 76 side. The bundle 50b (50d) loops in the Y-Z plane because the other end of the bundle 50b (i.e., the bundle 50d) is fixed by the clamp structures 140b and 140d. The structural member 146c includes several joints and electric terminals as necessary to connect the bundle 50d to the upper bundle 50c. The bundle 50c loops in the X-Z plane and is connected to the terminus 51 (see FIG. 1b) of the main stage.

Furthermore, in FIG. 1b, the terminus 51 is installed on the upper stage 22b, but it is also acceptable to install it on the lower stage 22a side. As evident from FIGS. 1b, 2b, and 3c, only the cable bundle 50a that loops on the X-Y plane deforms when the main stage and the follower stage assembly synchronize and move in the X direction. Because the cable follower stage 140 and the structures 146b, 146c, and 146d move in the Y direction altogether, only the cable bundle 50b (or 50d) deforms when the main stage moves in the Y direction. Because of this, the drag force of the cable bundle 50a is absorbed by the follower frame assembly, and the drag force of the cable bundle 50b, 50d is absorbed by the cable follower stage 140 (and structures 146b–146d) and the follower frame assembly. What could possibly give the drag force to the main stage in the end is the cable bundle 50c. However, the shape of the bundle 50c rarely changes no matter how the main stage moves because of the operation of the cable follower stage 140. Therefore, only a force that is smaller than the cable bundle 50c's weight will be added in the Z direction to the terminus 51 on the main stage side.

Figure 4:
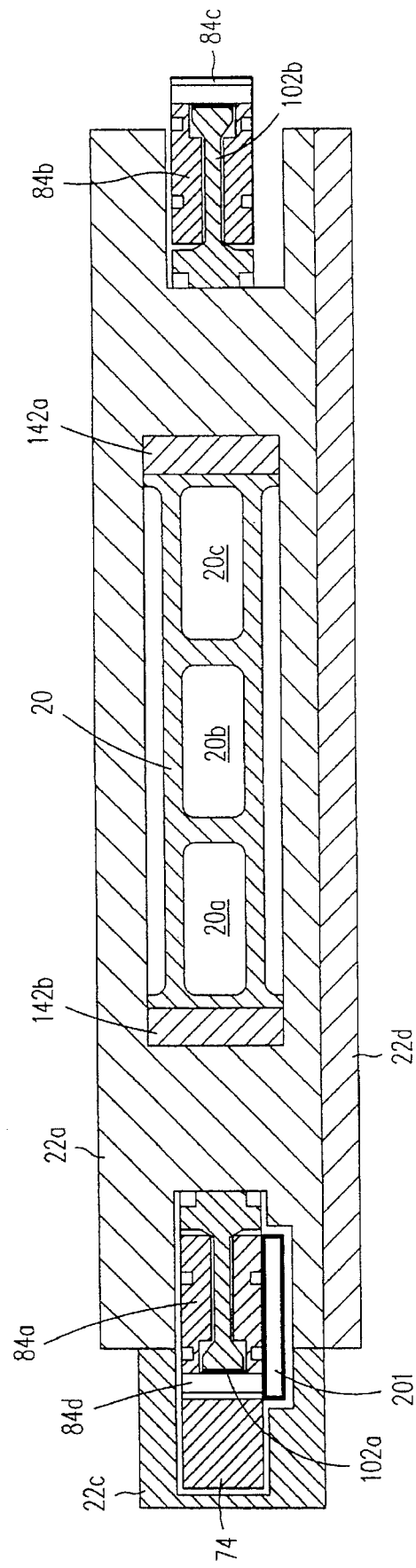

FIG. 4 illustrates in cross-section the beam 20, lower stage 22a, and associated structures. This cross-section is along line 4—4 shown in FIG. 3a.

The lower stage 22a in this embodiment surrounds the beam 20. (The beam depicted here is of the I-beam type in cross-section.) Beam 20 defines three internal void, 20a, 20b and 20c to minimize its weight. For guiding the main stage along the beam 20, air bearing/vacuum pads 142a, 142b (not seen in the other figures) are provided on both inner side portions of the lower stage 22a to produce static pressure gas bearings between the pads 142a, 142b and both side surfaces 106a of the beam 20. Pads 142a, 142b include rectangular air bearings located near each outside edge of lower stage 22a so as to minimize the friction between beam 20 and lower stage 22a. Furthermore, in FIG. 4, both the top portion and the bottom portion of the beam 20 are arranged leaving spaces of several mm or less from both the inner top wall and the inner bottom wall of the lower stage 22a. The air bearing/vacuum pad 22d for bearing on base 12 is shown on the lower portion of lower stage 22a. The linear motor coils 102a, 102b are attached to the sides of stage 22a and are shown in cross-section. The associated magnetic tracks 84a and 84b respectively surround motor coils 102a and 102b.

Magnetic tracks 84a, 84b are not part of the main stage, but instead are attached to the follower stage members 74, 76 respectively, and shown here for purpose of illustration. Also shown are backing plates 84c, 84d for magnetic tracks respectively 84b, 84a. A portion of follower frame member 74 is shown, to which is attached the magnetic track backing plate 84d. (The corresponding structure for track 84b is not shown).

The thermal stability of the stage mechanism is important to ensure accurate interferometry measurements and to eliminate change of thermal expansion due to thermal differentials. The interferometry problem is that warm air has a different index of refraction than does cooler air. The objective is maintain air temperature in the location of the interferometry laser beams within a few thousandths of a degree centigrade. In accordance with the embodiment of the invention, a general air flow supplied from an air temperature and humidity conditioner and HEPA filter (not shown) is maintained (in FIG. 1a) from the bottom left hand portion of the figure to the upper right hand portion. As an air conditioner, one of a type for an environment chamber that encloses an exposure apparatus, for instance, can be used. If the chamber is the side flow type (where the air flows laterally by installing an opening for ventilation with a HEPA filter on one side of the inner side wall, and installing a return duct on the other side of the inner side wall), the general air flow can be supplied by arranging the stage apparatus so as to agree with the X direction in FIG. 1a. Thus, it is important to keep warm air away from the interferometry mirrors 28 and 30. This accomplished by three cooling subsystems as described hereinafter.

First, the motor coils 102a and 102b on the stage are each liquid cooled by conventionally circulating liquid coolant within the base of the coil structure. The liquid coolant is water (or some other material such as Fluorinert) which is supplied by conventional tubing (part of the cable bundle not shown) and circulates through channels formed in the base of each motor coil 102a, 102b. (These channels are part of the above-described commercially available motor coils.)

Second, for further cooling, liquid coolant is circulated on the outer surfaces of the motor coils 102a, 102b.

Third, an air cooling system is provided for the side slot portions of the lower stage 22a surrounding the motor coils 102a, 102b in FIG. 2a. Heat baffle 22c (see FIG. 4 and FIG. 2b) surrounds the frame member 74 with magnetic track 84a and is attached to lower stage 22a without contacting the frame member 74. Heat exhaust tube (duct) 201 is a linear structure extending the length of the exterior of track 84a and located immediately below the track for elimination of warm air from within the "chamber" formed by the stage 22a and baffle 22c. Tube 201 is approximately 3 mm high and approximately 67 mm wide and defines at least one opening to admit warm air from within this "chamber". Tube 201 thus is a thin rectangular tube connected externally to an exhaust tube subject to vacuum (not shown). Tube 201 thereby is disposed inside heat baffle 22c to exhaust warm air from inside heat baffle 22c.

As evident from the structure shown in FIG. 4, the air in the slot of the magnetic track 84 is warmed by the coil 102a. If either the heat buffle 22c or the tube 21 is omitted, that warm air would flow out of the slot of the track 84, and a large fluctuation of the index of refraction caused in the space in front of the mirror 30, i.e., in the laser beam path of the X direction interferometer system. Therefore, it is advisable to install several spaced-apart through holes in the Y direction below the track 84a and construct track 84a so that the warm air can be rapidly exhausted to the inner space of the tube 201 from the slot space of the track 84a.

To enhance the circulation of air through the ducting, the "air plug"structures 104a, 104b shown in FIG. 2a are located at either end of the slot portion in the lower stage 22a in which the motor coil 102a is located. Each air plug 104a, 104b is of a size to closely fit around the corresponding magnetic track, but leaving a small gap between the air plug and the magnetic track so as to admit a flow of air into the slot of magnetic track 84b and the slot portion of lower stage 22a. This provides a positive flow of air which then flows into the "chamber" and then into the duct 201 adjacent the magnetic track and out through the connected vacuum tube. The air plugs 104a, 104b are thin pieces of e.g. plastic. A gap of approximately 1 mm between the edge of each air plug and the corresponding portion of the magnetic track allows air to enter past the air plug from outside. Thus the air plugs have the same cross sectional shape as do the coil 102a and are affixed to the end of the slot portion locating the coil 102a in the lower stage.

In this embodiment the heat baffle 22c and exhaust tube 201 are only located on one side of stage 22a, because the object is to divert heat away from the inferometery mirrors, and the overall air flow direction is from left to right in FIG. 1a. Thus in another embodiment, the heat baffle, duct and air plugs are also provided for motor coil 102b on the other side of stage 22a.

The follower stage and the beam are driven synchronously as described above. The typical maximum amount of motion between them is approximately plus or minus 1.0 mm. Thus the locational relationship between these two parts is essentially static. In one embodiment, the relative precision of movement of the main stage 22a is approximately plus or minus 10 nanometers. The follower stage accuracy of movement is approximately plus or minus 1 mm. Thus the main stage and the beam are driven in the X-axis direction so as to maintain a predetermined minimum gap (about 1 mm) between the motor coils on the main stage and the corresponding magnetic tracks on the follower stage. The cable follower stage accuracy is approximately 1 to 2 mm in the Y direction.

Figure 5:
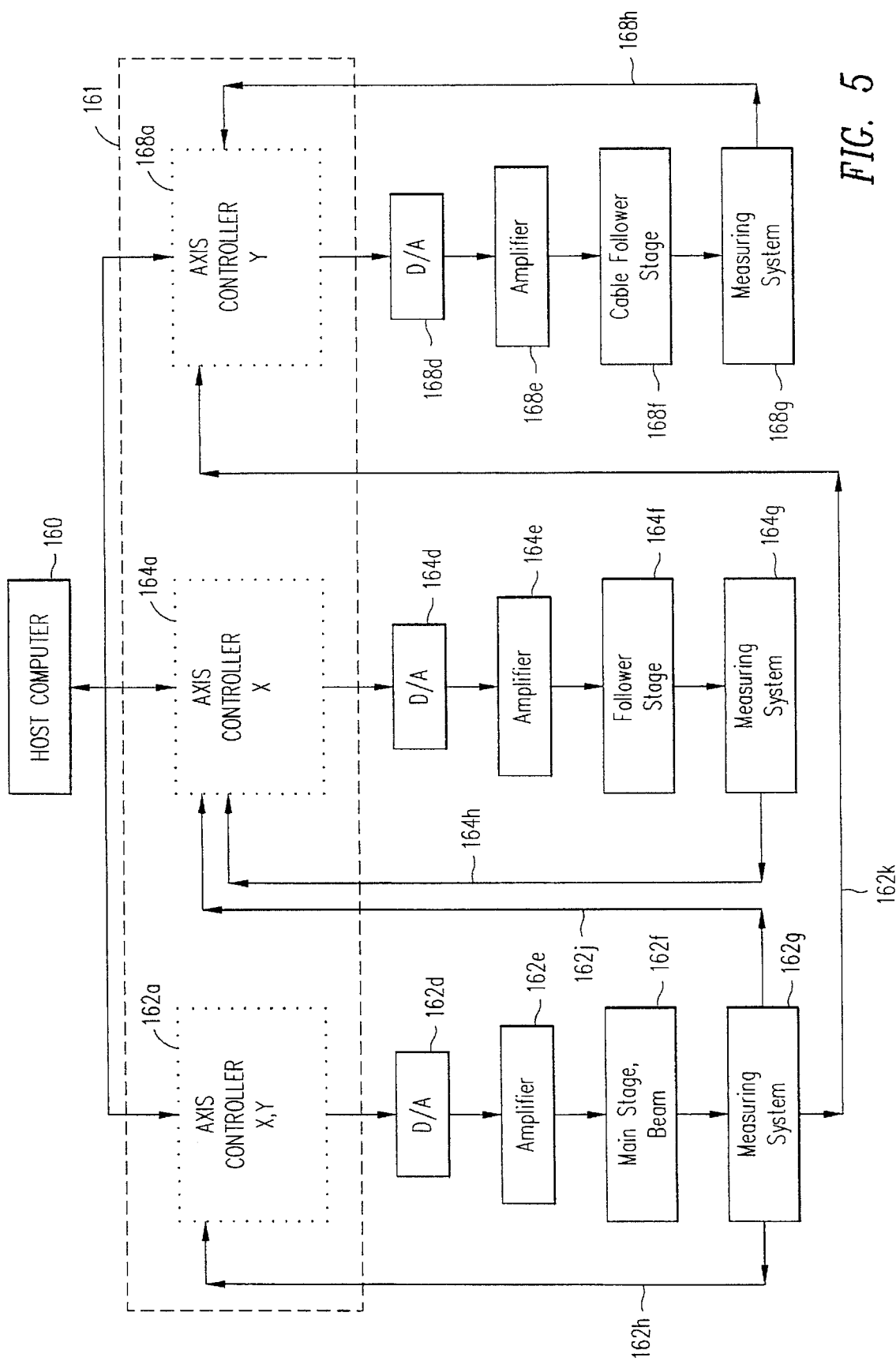

A system for controlling movement of the beam, the main stage, the follower frame stage, and the cable follower stage to meet these tolerances is shown in FIG. 5 in a block diagram. The control system synchronizes the movement in one dimension (X-axis) of the beam and the follower frame stage so that they move closely together with a minimum spacing between the main stage and the follower frame stage, by controlling the current to their respective motor coils 92, 110a, 110b. Also, the cable follower stage, which rides on the follower frame stage, is moved in synchronism with the main stage in the orthogonal direction (Y axis) so as to minimize cable drag by controlling the actuation of the motor 90a. Thus the control system synchronizes movement of the three stages and the beam.

The controlling portion 161 includes three axis controllers or CPUs. These are typically microprocessors or microcontrollers and may all be resident in one microprocessor.

Thus, the main stage axis controller 162a issues control signals to digital to analog (D/A) converter 162d, the output of which is then amplified by amplifier 162e to drive the motor coils 102a, 102b of the main stage (here designated 162f) and beam coils 110a, 110b. Follower frame stage axis controller 164a issues signals to the digital to analog converter 164d which are amplified by amplifier 164e to control the motor coils 92 of the follower frame stage, here designated 164f. Similarly, cable follower stage axis controller 168a via digital to analog converter 168d and amplifier 168e controls the motor 90a for the cable follower stage, here designated 168f.

It is to be understood that also a host computer 160 conventionally issues commands to axis controllers 162a, 164a, and 168a for movements in both X and Y directions.

Three position measuring systems 162g, 164g and 168g provide feedback. Measuring system 162g for the main stage includes the interferometry mirrors 28 and 30 mounted on the upper stage 22b. By means of laser beams reflected by mirrors 28, 30 the exact location on the base 12 in both the X and Y direction (and also the yaw component) of the upper stage 22b is measured. This is then provided for feedback purpose via lines 162h and 162k respectively to the axis controllers 162a and 168a.

A second measuring system 164g measures the position of the follower frame stage relative to the main stage. Measuring system 164g in one embodiment is an inductive-type proximity measurement sensor. The sensor element is disposed on one of the members of the follower frame stage, for instance, member 78 and senses the proximity of member 100. Sensor 164g thus measures the position of the follower frame stage relative to the main stage. The output of measuring system 164g is fed back via feedback line 164h to axis controller 164a for controlling coils 92 of the follower frame stage.

The third measuring system 168g for the cable follower stage is a conventional mechanical encoder which is a portion of cable follower stage rotary motor 90a. This encoder indicates the position of the cable follower stage. This measurement is fed back via line 168h to the cable follower stage axis controller 168a. This controller 168a mainly inputs the measuring signal in Y direction of the main stage via the line 162k and drives the motor 90a so that the measuring signal from the encoder system 168g would be within the range of 1 to 2 mm.

Signal path 162j is optional and provides a "feed forward" feature whereby the follower stage control elements, instead of merely following the beam movement along the X-axis, receive the movement commands from host computer 160 at the same time as do beam 20 control elements, thereby providing faster performance.

Thus the overall desired synchronism in the movements of the various elements of the entire stage assembly is maintained to within a desired tolerance. The movements of the main stage are most closely controlled by the most accurate measuring system, while the follower stage is somewhat less accurately controlled by a less accurate measuring system. Finally, the least accurate measuring system (mechanical encoding) is used for the portion of the system where motion control is least precise, which is the cable follower stage.

Additionally the linear motors 110a and 110b at either end of beam 20 are differentially driven by axis controller 162 to prevent and overcome any tendency of the beam to yaw. Thus control unit 162a provides different levels of current to each motor coil 110a and 110b. The amount of current provided to each motor coil is determined by a computer program in controller 162 in accordance with the measured location of the stage 22a on beam 20 as indicated on feedback line 162h. It is to be understood that the above-described air bearing structure associated with beam 20 also provides an anti-yaw effect; however, the differential drive provides higher anti-yaw performance than does the air bearings. Thus any tendency of beam 20 to yaw due to the location of stage 22a is overcome by this differential drive control. The goal is to prevent the beam 20 from pivoting, i.e. moving faster on one side versus the other, due to the reaction force exerted on beam 20 by the stage 22a.

Figure 6:
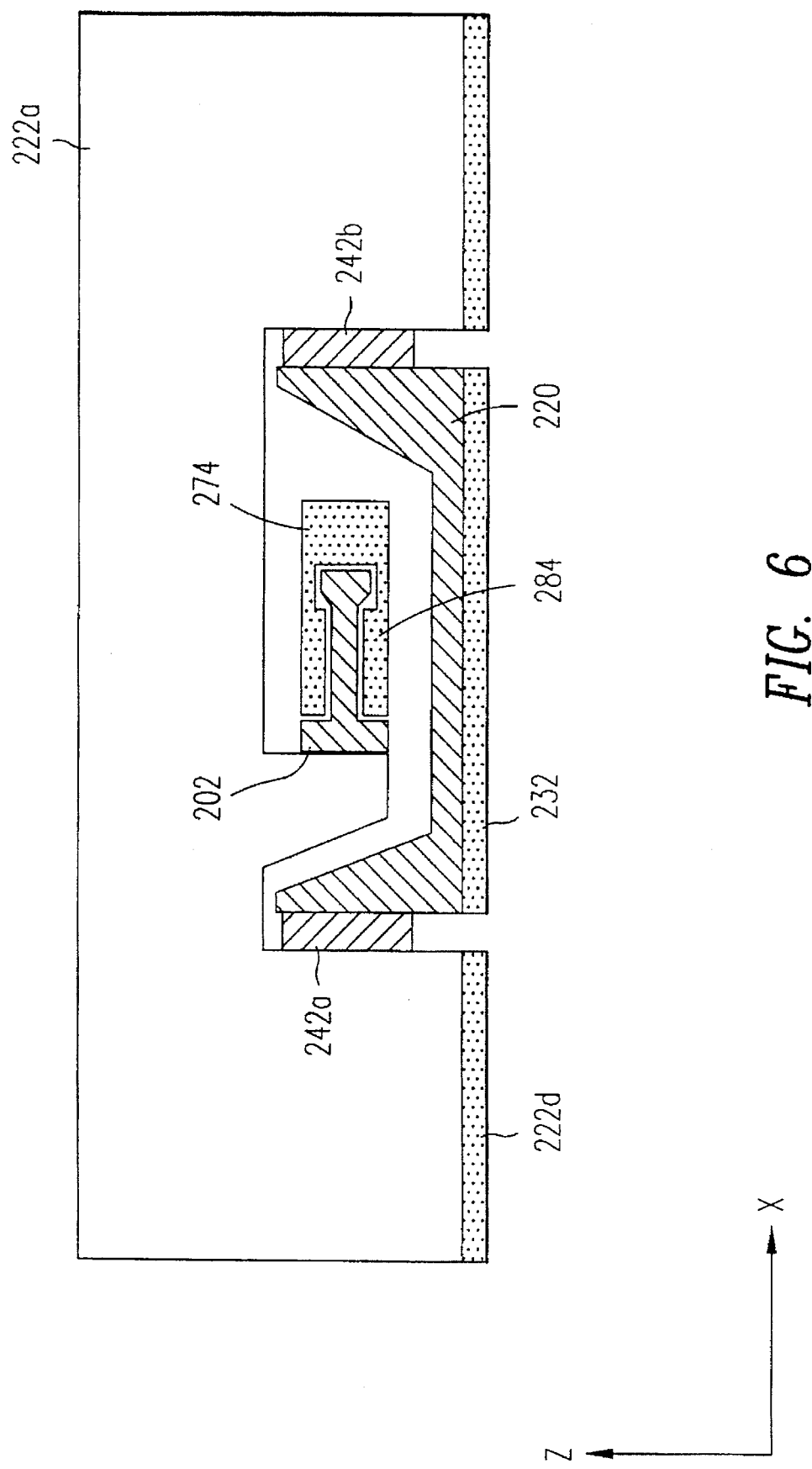
FIG. 6 shows a cross section of another embodiment of the beam, stage, and follower stage.

An alternate embodiment of the stage is shown in cross section in FIG. 6 showing only the beam, main stage, and follower frame stage. The follower frame stage 274, which is formed as a single bar, carries a single magnetic track 284 which is positioned at the center of the main (lower) stage 222a, near its center of gravity. The follower frame stage is constructed as in the previous embodiments with air bearings at the outside ends for support in the Z and Y directions and with linear motor coils at each end. A motor coil 202 is attached to the main stage 222a. The beam 220 is a "U" shaped structure with smooth side surfaces which guide air bearings 242a, 242b fixed on the main stage 222a to move the main stage 222a in the Y direction. The stage 222a is supported on the base surface 12a (not shown) through the air bearing system 222d provided to the underside of the stage 222a. The beam 220 is supported on air bearings 232. This embodiment is similar to the above-described embodiment but differs in that a single magnetic track 284 (single follower bar 274) drives the main stage 222a in the Y direction. It is also characterized by the stage 222a not completely surrounding the beam 220. That is, the main stage 222a is supported on the base 12 so that it straddles not only the beam 220 but also the follower bar 274 (with magnetic track 284). Furthermore, the beam is a "U" shaped structure with air bearings 232 directly under the beam 220 for support along its length instead of only at the ends of the beam. In the case shown in FIG. 6, a structure is necessary to support the follower bar stage 274 to the base 12 because the beam 220 will be arranged right underneath it. One example would be to have a structure where both ends in the Y direction of the follower bar stage 274 are supported in the Z direction by two fixed guides.

Figure 7:
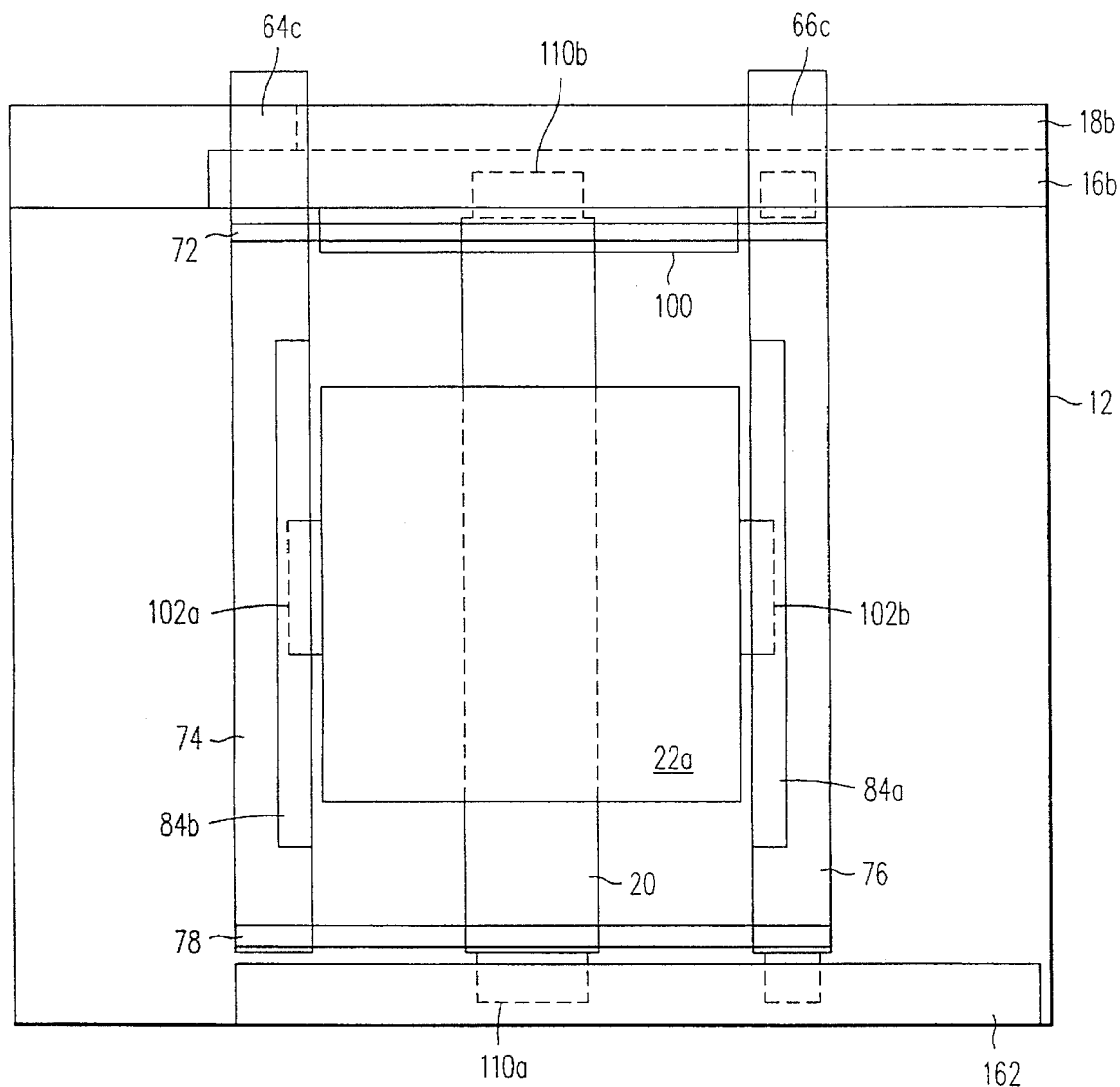
FIG. 7 shows a plan view of yet another embodiment, with one fixed guide.

FIG. 7 shows still another embodiment of the invention, in a plan view. This embodiment is the same as that of FIGS. 1a to 3c with similar elements identically labelled, except that guide 18a has been eliminated, and the air bearing structure 100 thus bears against the remaining guide 18b.

As another embodiment, it is also acceptable to form the pads 114a–114d of the air bearing/vacuum structure 100 that are shown in detail in FIG. 2a and the vacuum areas 116a–116c at the back of the structure 100, and the restraint of the entire beam 20 in Y direction can be provided by the bridge member 78 (FIGS. 1a, 1b). Guide 18a is not essential, but guide 18a helps prevent the entire beam 20 from significantly displacing itself in the guide 18a direction when the suction force in the Y direction between the structure 100 and the bridge 78 is lost under an unexpected condition. Furthermore, the relative position of the magnetic tracks and coils can be reversed.

The above description is illustrative and not limiting. Further modifications will be apparent to one skilled in the art in the light of this disclosure, and are intended to fall within the scope of the appended claims.

We claim:

1. A stage mechanism, comprising:

a base;

at least one linear guide mounted on said base and extending along a first direction;

a movable linear beam elongated in a second direction perpendicular to the first direction and guided slidably by said at least one linear guide;

a stage assembly guided movably in the second direction by said linear beam and movable in the first direction with said linear beam;

a follower stage located adjacent said stage assembly and not contacting said main stage assembly and guided slidably by said at least one linear guide;

a stage drive motor having a first portion on said stage assembly and a second portion on said follower stage, for moving said stage assembly in the second direction; and a follower drive motor for moving said follower stage in the first direction so as to follow movement of said stage assembly in the first direction with said linear beam.

2. The mechanism of claim 1, further comprising:

a beam drive motor having a first portion on said linear beam and a second portion on said base for moving said linear beam along said linear guide; and a control system operatively connected to said follower drive motor and said beam drive motor for moving said follower stage and said linear beam synchronously along said linear guide in the first direction.

3. The mechanism of claim 1, further comprising at least one fluid bearing system provided between a side guide surface of said linear beam and said main stage assembly.

4. The mechanism of claim 1, wherein said follower stage is a rectangular frame structure which comprises:

a first and second member extending along the second direction along each side of said stage assembly;

a third and a fourth member, each connecting said first and second members and extending along the first direction, wherein the second portion of said stage drive motor is on each of said first and second members of said frame structure.

5. The mechanism of claim 1, further comprising:

a linear support portion disposed on said follower stage and extending along the second direction; and a cable follower unit supported by said linear support and movable in the second direction, wherein said cable follower unit includes a cable fastener.

6. The mechanism of claim 5, further comprising:

a drive actuator operatively connected to said cable follower unit for moving said cable follower unit in the second direction; and a cable follower control system operatively connected to said drive actuator to move said cable follower unit synchronously with said stage assembly in the second direction.

7. The mechanism of claim 1, further comprising a plurality of air bearings provided between an under surface of said stage assembly and a main surface of said base.

8. The mechanism of claim 1, further comprising:

a first fluid bearing system for supporting said main stage assembly on a main surface of said base;

a second fluid bearing system for supporting said linear beam on said main surface of said base; and a third fluid bearing system for supporting said follower stage on said main surface of said base.

9. The mechanism of claim 1, wherein said movable linear beam extends through said stage assembly and the first portion of said stage drive motor is mounted in a side slot portion of said stage assembly, wherein said side slot portion is elongated along the second portion of said stage drive motor.

10. The mechanism of claim 9, wherein the second portion of said stage drive motor includes at least one magnetic track cooperating with the first portion of said stage drive motor, and said main stage assembly further comprises a ventilator duct connecting to said side slot portion.

11. The mechanism of claim 1, further comprising a first fluid bearing system provided between an end portion of said follower stage and said at least one linear guide.

12. The mechanism of claim 11, wherein said at least one linear guide includes first and second linear guides at each side of said follower stage and said movable linear beam, wherein said first fluid bearing system is provided between said follower stage and said first linear guide, and further comprising a second fluid bearing system provided between an end portion of said linear beam and said second linear guide.

13. The mechanism of claim 1, wherein said stage drive motor is an electro-magnetic linear motor having a coil assembly and a magnet assembly, and one of the first and second portions of said stage drive motor is the coil assembly and the other portion is the magnet assembly.

14. The mechanism of claim 1, wherein said linear beam includes a damping structure and is at least partly of ceramic material.

15. The mechanism of claim 1, wherein said main stage assembly is at least partly of ceramic material.

16. The mechanism of claim 1, further comprising a chuck mounted on said main stage assembly for supporting an object, wherein said chuck is at least partly of a ceramic material.

17. A movable apparatus comprising:

(a) a base structure having a flat principal surface;

(b) first and second linear guide members mounted on said base structure, said first and second guide members being parallel to each other in an X direction and separated in a Y direction perpendicular to the X direction;

(c) a movable guide member located between said first and second linear guide members, wherein said movable guide member is restricted by said first linear guide member and said flat principal surface of said base structure to move in the X direction;

d) a movable follower member located between said first and second linear guide members independently of said movable guide member, wherein said follower member is restricted by said second linear guide member and said flat principal surface of said base structure to move in the X direction;

(e) a main stage member restricted by the movable guide member and said flat principal surface of said base structure to move in the Y direction without contacting said follower member; and (f) an electro-magnetic force generator including a coil unit and a magnet unit to move said main stage member in the Y direction, wherein one of said units is mounted on said main stage member and the other is mounted on said follower member, thereby maintaining a predetermined gap between said units in the X direction.

18. A movable apparatus comprising:

(a) a base structure having a base surface;

(b) a first linear guide member mounted on said base structure and elongated in an X direction;

(c) a second linear guide member mounted on said base structure and elongated in the X direction and separated from said first linear guide member in a Y direction perpendicular to the X direction;

(d) a first movable assembly located between said first and second linear guide members and having a guide surface elongated in the Y direction, wherein said first movable assembly is guided by said first linear guide member and said base surface to move in the X direction;

(e) a main stage assembly guided by said first movable assembly and said base surface to move in the Y direction;

(f) a second movable assembly located between said first and second linear guide members and moving independently of said first movable assembly and said main stage assembly; and driven to maintain a predetermined space from said main stage assembly in the X direction by synchronous movement with said first movable assembly, wherein said second movable assembly is guided by said second linear guide member and said base surface; and (g) a linear motor assembly disposed between said main stage assembly and said second movable assembly to move said main stage assembly in the Y direction.

19. A movable apparatus comprising:

a base structure having a flat principal surface;

a main stage assembly movable in a first and a second direction on said flat principal surface, wherein said second direction is perpendicular to said first direction;

a cable bundle attached at one end to said main stage assembly and including at least a wire, an optical fiber, and a tube;

a cable follower stage assembly movable in the first and second directions on said flat principal surface, wherein a portion of said cable bundle is attached to said cable follower stage assembly; and a control system operatively connected to an actuator of said first stage assembly and to an actuator of said cable follower stage assembly for moving said cable follower stage assembly synchronously to said main stage assembly in the first and second directions.

20. The apparatus of claim 19, further comprising a fluid bearing mounted on a surface of said cable follower stage assembly facing said flat principal surface of said base structure.

21. The apparatus of claim 19, further comprising a follower stage assembly adjacent said main stage assembly, and movable in the first direction on said flat principal surface of said base structure;

wherein a drive motor is mounted on a first portion of said first stage assembly, and said cable follower stage assembly is connected to said drive motor, and wherein a surface of said cable follower stage assembly is in slidable contact with a second portion of said main stage assembly.

22. A movable assembly having a fluid cooling system, and comprising:

a base structure;

a main stage assembly movable on said base structure and having a motor coil mounted on a portion of said first assembly;

a follower stage assembly also movable on said base structure to maintain a predetermined spacing from said main stage assembly and having a magnetic track mounted on a portion of said follower stage assembly, wherein said motor coil and magnetic track cooperatively are a linear drive motor;

an enclosure mounted on said main stage assembly and at least partially surrounding said magnetic track, thereby to retain fluid inside said enclosure; and a duct extending along said main stage assembly adjacent said motor coil, and defining at least one opening adjacent said motor coil, thereby to receive fluid in the opening from a vicinity of said motor coil and vent the fluid from a distal end of said duct.

23. The movable assembly of claim 22, wherein said motor coil is mounted in an elongated recess on said main stage assembly; and further comprising a seal structure located at either end of said elongated recess, wherein each said seal structure substantially seals one end of the recess.

24. A mechanism comprising:

a base structure;

at least one guide member mounted on said base structure;

a movable beam of a ceramic material and in slidable engagement with said at least one guide member;

a main stage adjacent to said beam and moveable along said beam;

a follower assembly in slidable engagement with said at least one guide member, and located adjacent said main stage and spaced apart from said main stage and said movable beam;

a stage drive motor having a first portion mounted on said main stage and a second portion mounted on said follower assembly, for moving said main stage relative to said follower assembly; and a first portion of a follower drive motor on said follower stage for moving said follower assembly relative to a second portion of said follower drive motor and oriented at an angle to said stage drive motor.

25. A mechanism comprising:

a base structure;

at least one guide member mounted on said base structure;

a movable beam in slidable engagement with said at least one guide member;

a main stage at least partly of ceramic material and adjacent to said beam and movable along said beam;

a follower assembly in slidable engagement with said at least one guide member, and located adjacent said main stage and spaced apart from said main stage and said movable beam;

a stage drive motor having a first portion mounted on said main stage and a second portion mounted on said follower assembly, for moving said main stage relative to said follower assembly; and a first portion of a follower drive motor on said follower assembly for moving said follower assembly relative to a second portion of said follower drive motor and oriented at an angle to said stage drive motor.

26. A mechanism comprising:

a base structure;

at least one guide member mounted on said base structure;

a movable beam in slidable engagement with said at least one guide member;

a main stage adjacent to said beam and movable along said beam, wherein said main stage includes a chuck of a ceramic material;

a follower assembly in slidable engagement with said at least one guide member, and located adjacent said main stage and spaced apart from said main stage and said movable beam;

a stage drive motor having a first portion mounted on said main stage and a second portion mounted on said follower assembly, for moving said main stage relative to said follower assembly; and a first portion of a follower drive motor on said follower stage for moving said follower stage relative to a second portion of said follower drive motor and oriented at an angle to said stage drive motor.

27. A scanning exposure apparatus for exposing a pattern of a reticle onto a substrate by moving the reticle and substrate simultaneously in a predetermined scanning direction during an exposure sequence, the apparatus comprising:

(a) a base structure having a Z direction guide surface;

(b) at least one fixed guide member provided on said base structure and having an X direction guide surface extending in an X direction perpendicular to the Z direction;

(c) a movable guide member having a Y direction guide surface extending in a Y direction perpendicular to the X and Z directions, to move in the X direction on said Z direction guide surface by restriction of the X direction guide surface of said fixed guide member;

(d) a movable main stage supported on said Z direction guide surface and holding the substrate, for moving in the Y direction by restriction of the Y direction guide surface of said movable guide member and moving in the X direction by the movement of said movable guide member;

(e) a movable follower stage system having at least one frame portion elongated in the Y direction and located adjacent to said main stage, for moving in the X direction on said Z direction guide surface so as to maintain a predetermined spacing in the X direction from said main stage when said main stage is moved in the X direction; and (f) at least one linear motor provided between said main stage and the frame portion of said follower stage system, for moving said main stage in the Y direction;

wherein the scanning direction of said exposure sequence coincides with the Y direction and a cross scan direction coincides with the X direction.

28. The apparatus of claim 27, wherein said electromagnetic linear motor includes a coil assembly mounted on said main stage and a magnet assembly mounted on the frame portion of said follower stage system to generate force between said coil assembly and magnet assembly in the X direction.

29. The apparatus of claim 28, said follower stage system further comprising:

a measuring system for detecting a positional relationship between said main stage and the frame portion of said follower stage system in the Y direction; and a drive assembly for actuating the frame portion of said follower stage system in accordance with the detected positional relationship, thereby to maintain said predetermined spacing in the X direction.

30. The apparatus of claim 29, wherein said fixed guide member includes a first fixed guide member mounted on said base structure for guiding said movable guide member in the X direction and a second fixed guide member mounted on said base structure for guiding said follower stage system in the X direction.

31. The apparatus of claim 28, wherein said follower stage system includes a first and a second frame portions which are parallel to one another, and said magnet assembly of said electro-magnetic linear motor includes a first and a second magnetic track respectively mounted on said first and second frame portions, wherein said main stage is arranged between said first and second frame portions, and said coil assembly of said electro-magnetic linear motor includes a first and a second coil units respectively cooperating with said first and second magnetic tracks.

32. The apparatus of claim 31, wherein at least one of said first and second frame portions of said follower stage system includes an exhaust structure for exhausting fluid through the magnetic track.

* * * * *